(12) United States Patent
Sugahara

(10) Patent No.: US 7,793,394 B2
(45) Date of Patent: Sep. 14, 2010

(54) METHOD OF PRODUCING PIEZOELECTRIC ACTUATOR

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 403 days.

(21) Appl. No.: 11/412,775

(22) Filed: Apr. 28, 2006

(65) Prior Publication Data

US 2006/0242806 A1   Nov. 2, 2006

(30) Foreign Application Priority Data

Apr. 28, 2005   (JP)   ............... 2005-131574

(51) Int. Cl.
*H01L 41/00* (2006.01)
*H04R 17/00* (2006.01)
*H01S 4/00* (2006.01)
*G01R 3/00* (2006.01)

(52) U.S. Cl. .................. 29/25.35; 29/592.1; 29/595

(58) Field of Classification Search ........... 29/25.35, 29/592.1, 595; 310/323.17, 328
See application file for complete search history.

(56) References Cited

U.S. PATENT DOCUMENTS

| | | | | |
|---|---|---|---|---|
| 5,132,582 A | * | 7/1992 | Hayashi et al. | 310/323.16 |
| 5,265,315 A | * | 11/1993 | Hoisington et al. | 29/25.35 |
| 5,489,930 A | * | 2/1996 | Anderson | 347/71 |
| 5,622,748 A | * | 4/1997 | Takeuchi et al. | 427/100 |
| 5,842,258 A | * | 12/1998 | Harvey et al. | 29/890.1 |
| 6,871,400 B2 | * | 3/2005 | Kitahara | 29/890.1 |
| 6,895,669 B2 | * | 5/2005 | Ito et al. | 29/890.1 |
| 6,993,840 B2 | * | 2/2006 | Mouri et al. | 29/890.1 |
| 7,076,873 B2 | * | 7/2006 | Sugahara et al. | 29/890.1 |
| 7,225,513 B2 | * | 6/2007 | Yao et al. | 29/25.35 |
| 7,291,960 B2 | * | 11/2007 | Iwashita et al. | 310/363 |
| 7,417,358 B2 | * | 8/2008 | Sugahara | 310/328 |
| 7,456,548 B2 | * | 11/2008 | Kubota et al. | 310/324 |
| 2001/0001458 A1 | * | 5/2001 | Hashizume et al. | 216/2 |
| 2003/0145463 A1 | * | 8/2003 | Nishikawa et al. | 29/890.1 |
| 2004/0104981 A1 | * | 6/2004 | Fujii et al. | 347/71 |
| 2005/0046312 A1 | * | 3/2005 | Miyoshi | 310/366 |
| 2005/0082662 A1 | * | 4/2005 | Nakamura et al. | 257/703 |

(Continued)

FOREIGN PATENT DOCUMENTS

EP   1104034 A1   5/2001

(Continued)

OTHER PUBLICATIONS

European Patent Office, European Search Report for Related Application No. EP 06008839.0 dated Sep. 13, 2007.

*Primary Examiner*—A. Dexter Tugbang
*Assistant Examiner*—David P Angwin
(74) *Attorney, Agent, or Firm*—Baker Botts, LLP.

(57) ABSTRACT

A plurality of drive sections are defined by forming a plurality of slits in a plate-shaped member. Then, a plurality of piezoelectric layers are formed in the drive sections respectively by depositing particles of a piezoelectric material onto the plate-shaped member. Subsequently, after forming individual electrodes on the piezoelectric layers respectively, the drive sections are bent in a direction orthogonal to a plane direction of the plate-shaped member. Thus, there is provided a method of easily producing a piezoelectric actuator including the drive sections which are bent-shaped and on which the piezoelectric layers are formed respectively.

13 Claims, 25 Drawing Sheets

U.S. PATENT DOCUMENTS

| | | |
|---|---|---|
| 2005/0127780 A1* | 6/2005 | Ifuku et al. .................. 310/311 |
| 2005/0145606 A1* | 7/2005 | Simon ................... 219/121.61 |
| 2006/0066177 A1 | 3/2006 | Sugahara |

FOREIGN PATENT DOCUMENTS

| | | |
|---|---|---|
| EP | 1109233 A1 | 6/2001 |
| GB | 2381376 A | 4/2003 |
| JP | H05105291 | 4/1993 |
| JP | 2003111456 | 4/2003 |
| JP | 2003118868 | 4/2003 |
| JP | 2004278911 | 9/2004 |
| WO | 03/063262 A2 | 7/2003 |
| WO | 03/071613 A2 | 8/2003 |

* cited by examiner

METHOD OF PRODUCING PIEZOELECTRIC ACTUATOR

BACKGROUND OF THE INVENTION

1. Field of the Invention

The present invention relates to a method of producing a piezoelectric actuator used in a transporting apparatus or the like.

2. Description of the Related Art

A transporting apparatus which includes a transporting roller and a drive motor which drives the transporting roller has been hitherto generally used for transporting a paper or the like to be recorded in a recording apparatus. However, in recent years, a technology for applying a piezoelectric actuator, having a piezoelectric element made of a ceramics material such as lead zirconate titanate (PZT), to a variety of usages has been studied, and in particular, a technology for transporting an object (transportation object) by utilizing a deformation which is developed when a voltage is applied to the piezoelectric element has been proposed. For example, Japanese Patent Application Laid-open Publication No. 2003-111456 describes a piezoelectric actuator which has a plurality of piezoelectric actuator elements each of which includes a substrate in the form of a plate, piezoelectric elements provided to both surfaces of the substrate respectively, and a plurality of electrodes formed on surfaces of the piezoelectric elements respectively. This piezoelectric actuator is structured such that a front tip portion of the substrate is caused to be deformed due to bending deformation of the piezoelectric element, and an object which is cylindrical or tubular in shape can be transported by being moved by a very small amount in a longitudinal direction of the object by a ciliary movement of a plurality of substrates arranged in a circumferential direction of the cylindrical or tubular object. However, this transporting apparatus is structured to transport an object which is mainly cylindrical or tubular in shape, and thus there is a restriction on the shape of the object which can be transported. Accordingly, it is difficult to use this piezoelectric actuator for transporting an object which has a shape other than the cylindrical or tubular shape, such as a paper.

In view of this situation, the inventor of the present application invented a piezoelectric actuator which is capable of transporting objects which have various shapes along a predetermined transportation plane, by a minute feed amount (U.S. patent application Ser. No. 11/235,313 filed on Sep. 27, 2005, published on Mar. 30, 2006 as US 2006/0066177 and corresponding to Japanese Patent Application No. JP 2004-278911). In the piezoelectric actuator, each of the actuator elements has a drive section (bent thin plate section) which projects in a direction orthogonal to a transporting plane, and a piezoelectric layer arranged in the drive section. The drive section has a contact section which makes contact with an object and two inclined sections extending from the contact section, and the piezoelectric layer, made of a ferroelectric substance such as lead zirconate titanate, is formed as two piezoelectric layers arranged in the two inclined sections respectively. When an electric field acts on the piezoelectric layer of the piezoelectric actuator, the piezoelectric layer is deformed to cause the inclined section to deform to be bent. The contact section between the two inclined sections is displaced by this bending deformation, thereby making it possible to transport the object by a minute feed amount.

When the piezoelectric actuator capable of realizing transportation by a minute feed amount is manufactured, it is necessary to form the drive sections of the actuator elements to be bent in a projecting manner, and to form piezoelectric layers in the two inclined sections respectively of each of the drive sections. However, with a conventional method of forming a piezoelectric layer entirely on the plate-shaped member and then processing the plate-shaped member so that the actuator elements are formed in a divided manner, it is difficult to form the actuator elements having a bent shape, and also disadvantageous in view of producing cost. Accordingly, there has been a demand for a method with which a piezoelectric actuator having such a structure can be produced more easily.

SUMMARY OF THE INVENTION

An object of the present invention is to provide a method of producing a piezoelectric actuator with which a piezoelectric actuator having a drive section in a bent shape and a piezoelectric layer arranged in the drive section can be produced more easily.

According to a first aspect of the present invention, there is provided a method of producing a piezoelectric actuator having an actuator element, the method including: a step for providing a plate-shaped member; a drive section forming step of forming a slit in the plate-shaped member to define a drive section; a piezoelectric layer forming step of forming a piezoelectric layer in the drive section by depositing particles of a piezoelectric material onto one surface of the plate-shaped member; an electrode forming step of forming, in the piezoelectric layer, an electrode for applying electric field in a thickness direction of the piezoelectric layer; and a bending step of bending the drive section.

According to the first aspect of the present invention, a plate-shaped member is firstly prepared, and a drive section is defined by forming a slit in the plate-shaped member. Next, after forming a piezoelectric layer in the drive section by depositing particles of a piezoelectric material onto one surface of the plate-shaped member, the drive section is bent such that the drive section is made to project in a direction different from the plane direction of the plate-shaped member (alternatively, after bending the drive section, the piezoelectric layer is formed in the drive section by depositing the particles of piezoelectric material onto the plate-shaped member). In this case, when the particles of piezoelectric material are deposited onto the plate-shaped member, the particles of piezoelectric material do not deposit onto a part of the plate-shaped member at which the slit is formed. Accordingly, it is easy to form the piezoelectric layer only on the surface of drive section. This makes it possible to produce the piezoelectric actuator having the bent-shaped drive section and the piezoelectric layer arranged in the drive section easily, and also to lower the producing cost.

In the method of producing the piezoelectric actuator, the bending step may be performed after the piezoelectric layer forming step. In this case, the piezoelectric layer is formed by depositing the particles of piezoelectric material onto the surface of drive portion which is still flat before being subjected to the bending processing. Accordingly, a piezoelectric layer with uniform thickness can be easily formed on the surface of the drive section.

In the method of producing the piezoelectric actuator, the plate-shaped member may be made of a metallic material. In this case, even when a plurality of slits are to be formed, the slits can be easily formed by etching or the like. Also, the bending processing of the driving section can be performed easily.

The method of producing the piezoelectric actuator may further include, before the piezoelectric layer forming step, an insulating layer forming step of forming an insulating layer on the one surface of the plate-shaped member; wherein in the electrode forming step, the electrode and a wiring which is to be connected to the electrode may be formed on a surface of the insulating layer. Although the electrode formed on the piezoelectric layer needs to be electrically connected to a drive circuit for supplying drive voltage, it is difficult to connect the electrode arranged on the surface of the bent-shaped drive section to the drive circuit, and the structure for electrical connection between the electrode and drive circuit tends to be complex as a wiring member such as FPC (Flexible Printed Circuit) or the like is required. According to the method of producing the piezoelectric actuator, however, the electrode is arranged on the surface of the plate-shaped member via the insulating layer, and the wiring to be connected to the electrode can be wired freely on the surface of this insulating layer. Accordingly, it is possible to simplify the structure for electric connection between the electrode and the drive circuit. In addition, when the drive circuit is arranged on the surface of the insulating layer, it is possible to connect the drive circuit directly to the electrode by the wiring on the surface of the insulating layer, thereby omitting the wiring member such as FPC.

In the method of producing the piezoelectric actuator, in the piezoelectric layer forming step, the piezoelectric layer may be formed by one of an aerosol deposition method, a chemical vapor deposition method and a sputtering method. By forming the piezoelectric layer by means of the aerosol deposition method, the chemical vapor deposition method or the sputtering method, it is possible to easily form the piezoelectric layer with a desired thickness.

The method of producing the piezoelectric actuator may include, before the bending step, a recess forming step of forming a recess in the plate-shaped member at a portion which is to be bent in the bending step. Accordingly, the bending of the drive section in the bending step can be performed more easily.

In the method of producing the piezoelectric actuator, in the drive section forming step, the slit may be formed as a plurality of individual slits which extend in a first direction, and aligned in a second direction different from the first direction; and the drive section may be defined, by the individual slits, as a plurality of individual drive sections which are aligned along the second direction. In this case, a piezoelectric actuator having a plurality of individual drive sections can be produced easily.

In the method of producing the piezoelectric actuator, in the drive section forming step, the individual slits may be formed such that each of the individual drive sections is connected, at both ends thereof in the first direction, to the plate-shaped member; and in the bending step, each of the individual drive sections may be bent at the both ends thereof in the first direction and at a middle portion thereof located between the both ends. In this case, a piezoelectric actuator having a plurality of drive sections each of which projects, in the direction different from the direction of the plane of the plate-shaped member, at a middle portion thereof can be produced easily.

In the method of producing the piezoelectric actuator, in the drive section forming step, the individual slits may be formed such that each of the individual drive sections is connected, only at one end thereof in the first direction, to the plate-shaped member; and in the bending step, each of the individual drive sections may be bent at the one end thereof in the first direction such that each of the individual drive sections is parallel to a direction different from a direction of a plane of the plate-shaped member. In this case, a piezoelectric actuator having a plurality of drive sections each of which is bent at one end thereof and extends in a direction different from the direction of the plane of the plate-shaped member can be produced easily.

In the method of producing the piezoelectric actuator, the first direction may be orthogonal to the second direction. In this case, it is possible to perform the bending step for the plurality of drive sections easily.

In the method of producing the piezoelectric actuator, the plate-shaped member may serve as a common electrode. In order to make an electric field act in the piezoelectric layer in its thickness direction so as to deform the piezoelectric layer, it is necessary to arrange electrodes on both sides of the piezoelectric layers respectively. However, with a construction in which the drive section made of a metallic material serves also as one of the electrodes, it is possible to omit a step for forming the one of the electrodes.

In the method of producing the piezoelectric actuator, the piezoelectric actuator may be provided in a transporting apparatus which transport an object in a predetermined transporting direction. In this case, it is possible to easily produce a piezoelectric actuator applicable to a transporting apparatus capable of transporting objects having various shapes by a minute feed amount.

According to a second aspect of the present invention, there is provided a method of producing a movable apparatus which moves with respect to an object, the method including the steps of: providing a plate-shaped substrate; producing a piezoelectric actuator with the method according to the first aspect of the present invention; and joining the substrate and the piezoelectric actuator at the other surface of the plate-shaped member of the piezoelectric actuator. In this case, it is possible to easily produce a piezoelectric actuator applicable to a movable apparatus movable by a minute feed amount.

BRIEF DESCRIPTION OF THE DRAWINGS

FIGS. 2A and 2B show a piezoelectric actuator, in which FIG. 2A is a plan view of the piezoelectric actuator and FIG. 2B is a sectional view taken along a line IIB-IIB in FIG. 2A;

FIGS. 3A and 3B show one of actuator elements, in which FIG. 3A is a cross-sectional view of the actuator element and FIG. 3B is a sectional view taken along a line IIIB-IIIB in FIG. 3A;

FIGS. 7A and 7B show a drive section forming step and a recess forming step in a method of producing the piezoelectric actuator of the first embodiment, wherein FIG. 7A is a plan view of the piezoelectric actuator and FIG. 7B is a sectional view taken along a line VIIB-VIIB in FIG. 7A;

FIGS. 8A and 8B show a step for arranging a mask, wherein FIG. 8A is a plan view of the piezoelectric actuator and FIG. 8B is a sectional view taken along a line VIIIB-VIIIB in FIG. 8A;

FIGS. 9A and 9B show a piezoelectric layer forming step, wherein FIG. 9A is a plan view of the piezoelectric actuator and FIG. 9B is a sectional view taken along a line IXB-IXB in FIG. 9A;

FIGS. 10A and 10B show an individual electrode forming step, wherein FIG. 10A is a plan view of the piezoelectric actuator and FIG. 10B is a sectional view taken along a line XB-XB in FIG. 10A;

FIGS. 11A and 11B show a bending step, wherein FIG. 11A is a plan view of the piezoelectric actuator and FIG. 11B is a sectional view taken along a line XIB-XIB in FIG. 11A;

FIGS. 14A and 14B show a drive section forming step and a recess forming step in a method of producing the piezoelectric actuator shown in FIG. 13, wherein FIG. 14A is a plan view of the piezoelectric actuator and FIG. 14B is a sectional view taken along a line XIVB-XIVB in FIG. 14A;

FIGS. 15A and 15B show an insulating layer forming step, wherein FIG. 15A is a plan view of the piezoelectric actuator and FIG. 15B is a sectional view taken along a line XVB-XVB in FIG. 15A;

FIGS. 16A and 16B show an individual electrode forming step, wherein FIG. 16A is a plan view of the piezoelectric actuator and FIG. 16B is a sectional view taken along a line XVIB-XVIB in FIG. 16A;

FIGS. 17A and 17B show a step for arranging a mask, wherein FIG. 17A is a plan view of the piezoelectric actuator and FIG. 17B is a sectional view taken along a line XVIIB-XVIIB in FIG. 17A;

FIGS. 18A and 18B show a piezoelectric layer forming step, wherein FIG. 18A is a plan view of the piezoelectric actuator and FIG. 18B is a sectional view taken along a line XVIIIB-XVIIIB in FIG. 18A;

FIGS. 19A and 19B show a common electrode forming step, wherein FIG. 19A is a plan view of the piezoelectric actuator and FIG. 19B is a sectional view taken along a line XIXB-XIXB in FIG. 19A;

FIGS. 20A and 20B show a bending step, wherein FIG. 20A is a plan view of the piezoelectric actuator and FIG. 20B is a sectional view taken along a line XXB-XXB in FIG. 20A;

FIGS. 21A and 21B show a piezoelectric actuator of a second embodiment, wherein FIG. 21A is a plan view of the piezoelectric actuator and FIG. 21B is a sectional view taken along a line XXIB-XXIB in FIG. 21A;

FIGS. 22A and 22B show a drive section forming step in a method of producing the piezoelectric actuator of the second embodiment, wherein FIG. 22A is a plan view of the piezoelectric actuator and FIG. 22B is a sectional view taken along a line XXIIB-XXIIB in FIG. 22A;

FIGS. 23A and 23B show a step for arranging a mask, wherein FIG. 23A is a plan view of the piezoelectric actuator and FIG. 23B is a sectional view taken along a line XXIIIB-XXIIIB in FIG. 23A;

FIGS. 24A and 24B show a piezoelectric layer forming step, wherein FIG. 24A is a plan view of the piezoelectric actuator and FIG. 24B is a sectional view taken along a line XXIVB-XXIVB in FIG. 24A;

FIGS. 25A and 25B show an individual electrode forming step, wherein FIG. 25A is a plan view of the piezoelectric actuator and FIG. 25B is a sectional view taken along a line XXVB-XXVB in FIG. 25A;

FIGS. 26A and 26B show a bending step, wherein FIG. 26A is a plan view of the piezoelectric actuator and FIG. 26B is a sectional view taken along a line XXVIB-XXVIB in FIG. 26A.

DESCRIPTION OF THE PREFERRED EMBODIMENTS

Figure 1:
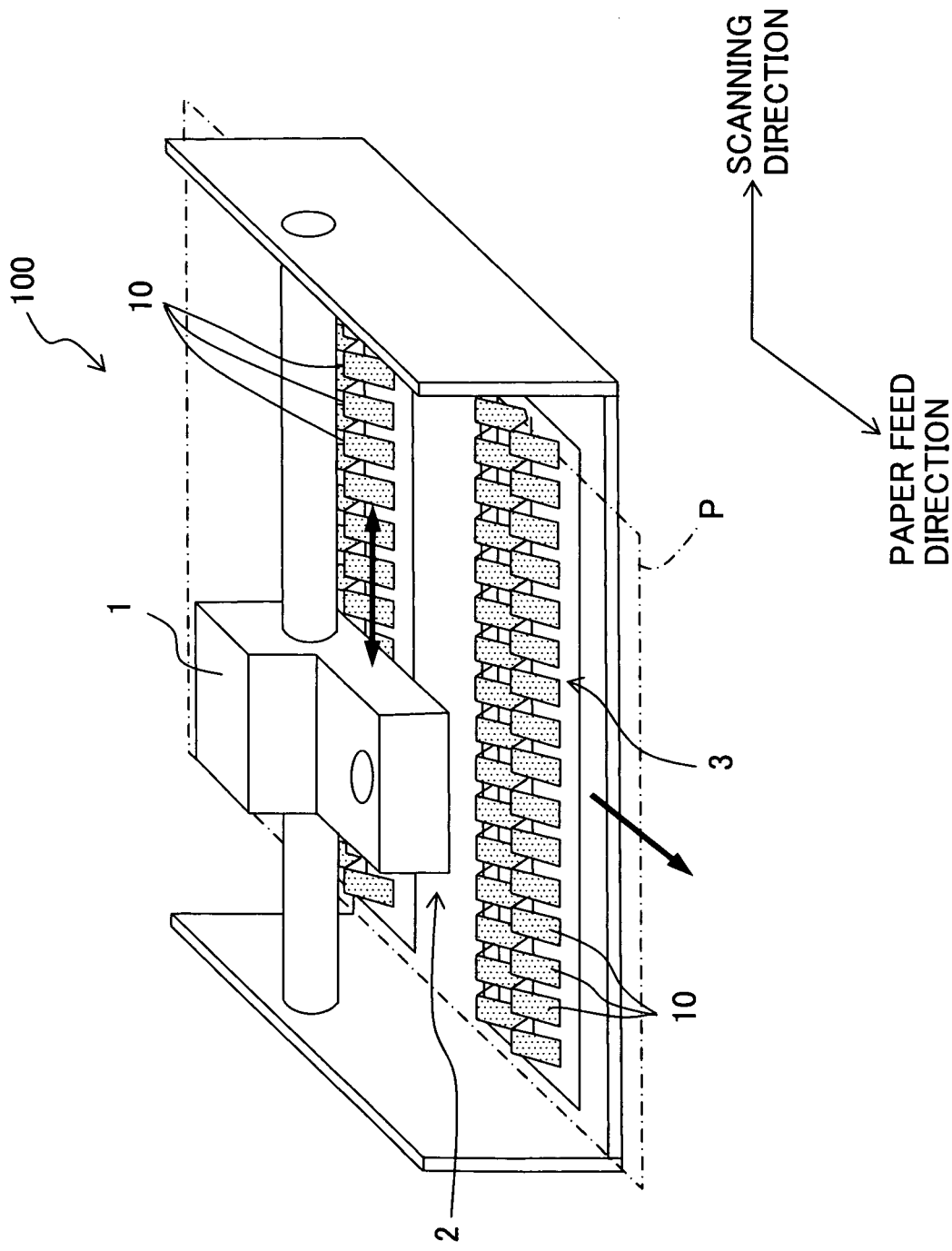
FIG. 1 is a schematic perspective view of an ink-jet printer according to a first embodiment of the present invention.

A first embodiments of the present invention will be explained. The first embodiment is an example in which the present invention is applied to a piezoelectric actuator for transporting a paper in an ink-jet printer. First, the ink-jet printer will be explained briefly. As shown in FIG. 1, an ink-jet printer 100 includes a carriage 1 which is movable in a scanning direction (left and right direction) in FIG. 1, an ink-jet head 2 of a serial type which is provided to the carriage 1 and which discharges ink onto a recording paper P, a paper transporting apparatus 3 which transports or feeds the recording paper P in a forward direction (forward in a transporting direction) in FIG. 1. The ink-jet head 2 moves integrally with the carriage 1 in the scanning direction, and discharges ink onto the paper P, which is transported in the forward direction by the paper transporting apparatus 3, from ejecting ports of nozzles formed in the lower surface of the ink-jet head 2.

Next, the paper transporting apparatus 3 will be explained. As shown in FIGS. 1 and 2, the paper transporting apparatus 3 includes a substrate 25 forming a horizontal bottom surface (plane), two actuators 5 provided in the substrate 25, and a guide member 11 which is arranged horizontally above each of the actuators 5 to face the actuator 5. The piezoelectric actuators 5 are arranged such that one of the piezoelectric actuators 5 is on an upstream side (toward the rear in FIG. 1) and the other of the piezoelectric actuators 5 is on a downstream side (toward the front in FIG. 1) of the ink-jet head 2, in the transporting direction. Further, each of the piezoelectric actuators 5 has a plurality of actuator elements 10 which are aligned in two rows in the scanning direction (left and right direction in FIG. 1) along the horizontal plane.

Figure 2A:
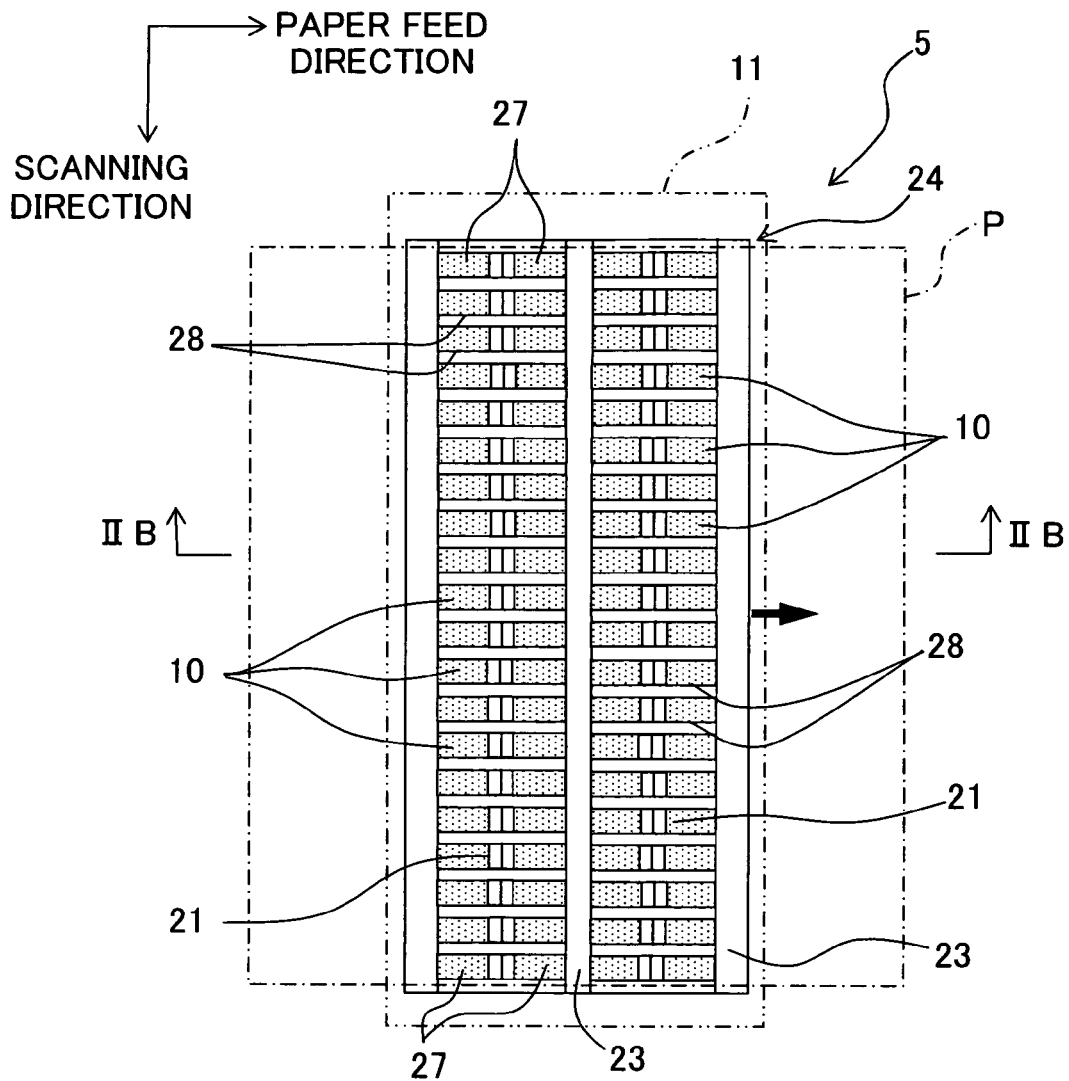
Figure 2B:
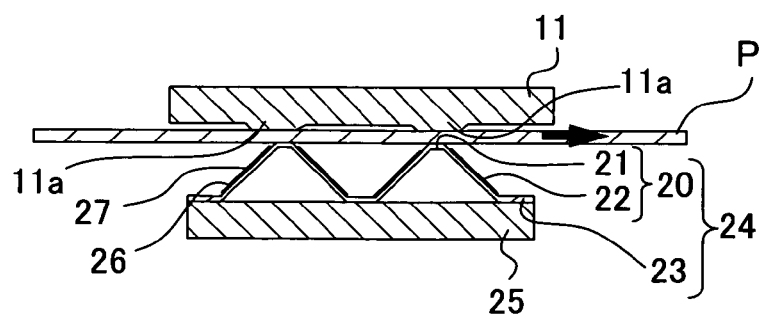
Figure 3A:
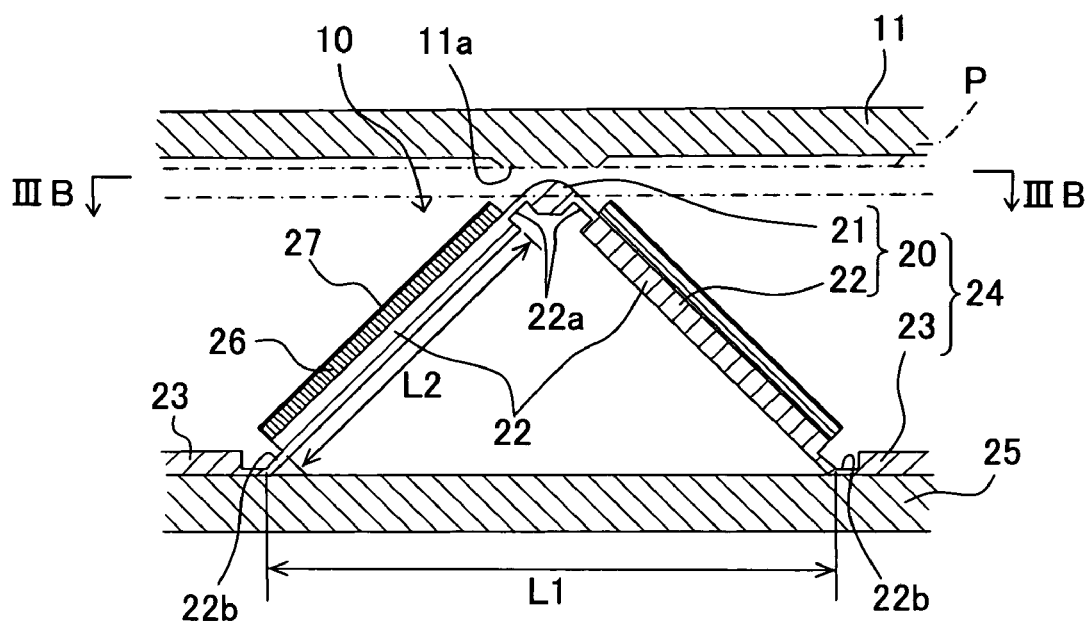

As shown in FIGS. 2B and 3A, each of the actuator elements 10 has a drive section 20 which is formed, in a plate-shaped member 24 made of a metallic material such as an iron-based alloy, titanium-based alloy, aluminum-based alloy or nickel-based alloy, such that the drive section 20 projects upwardly (in a direction orthogonal to a plane direction of the plate-shaped member 24), and a drive section 20 of one actuator element 10 and a drive section 20 of another actuator element adjacent to the drive section in the scanning direction are connected with each other by a base section (base) 23. As shown in FIG. 2A, in the plate-shaped member 24, the drive sections 20 extend in a transporting direction (first direction) respectively, and the drive sections 20 are defined by a plurality of slits 28 formed to be aligned in two rows in the scanning direction (second direction). Each of the drive sections 20 includes a contact section 21 disposed in an upper edge and capable of making contact with the paper P from a lower side, and two inclined sections 22 each extending from the contact section 21 in a direction parallel to the transporting direction (left and right direction in FIG. 2A) in a plan view. In addition, the base sections 23, which extend in the scanning direction (up and down direction in FIG. 2A), are connected to the two inclined sections 22, and each of the drive sections 20 is connected to another drive section 20, which is adjacent thereto in the scanning direction, at both ends of the drive section 20 via the base sections 23 respectively. Further, as shown in FIG. 2B, the base sections 23 are fixed to the horizontal substrate 25. The drive sections 20 and the base sections 23 are formed as an integrated body by one plate-shaped member 24 made of a metal. Therefore, the number of components of the piezoelectric actuators 5 is reduced.

As shown in FIG. 3A, the contact section 21 is formed to have somewhat round shape and an upper surface of the contact section 21 is roughened by a sand blast, a micro blast or the like. Piezoelectric layers 26, mainly composed of lead zirconate titanate (PZT) which is a solid solution of lead titanate and lead zirconate and is a ferroelectric substance, are formed on upper surfaces of the inclined sections 22, respectively.

In each of the actuator elements 10, individual electrodes 27 are formed entirely on the upper surfaces (surfaces on a side opposite to the inclined section 22) of the two piezoelectric layers 26, respectively. These two individual electrodes 27 are connected electrically to a driving circuit (not shown) via a wiring member (not shown) such as a Flexible Printed Circuit (FPC), and a drive voltage is applied to the individual electrodes 27 by the driving circuit. On the other hand, the metallic inclined sections 22 positioned at a lower side of the piezoelectric layers 26 are always maintained at ground potential via the base sections 23. In other words, each of the inclined sections 22 serves also as a common electrode which generates an electric field in the piezoelectric layer 26 sandwiched between the inclined section 22 and the individual electrode 27 when the drive voltage is applied to the individual electrode 27 by the driving circuit. Accordingly, there is no need to form the common electrode separately from the inclined section 22.

When the drive voltage is applied to the individual electrode 27 by the driving circuit, there is a difference in electric potential between the individual electrode 27 and the inclined section 22 which serves as the common electrode maintained at the ground potential, and an electric field is generated in the piezoelectric layer 26 in a direction of thickness thereof, the piezoelectric layer 26 being sandwiched between the individual electrode 27 and the inclined section 22. At this time, when the direction in which the piezoelectric layer 26 is polarized is same as the direction of electric field, the piezoelectric layer 26 expands in the thickness direction, and thus contracts in a direction orthogonal to the thickness direction, that is a plane direction of the piezoelectric layer 26. With this contraction of the piezoelectric layer 26, the inclined section 22 is deformed so as to project inwardly.

Figure 4:
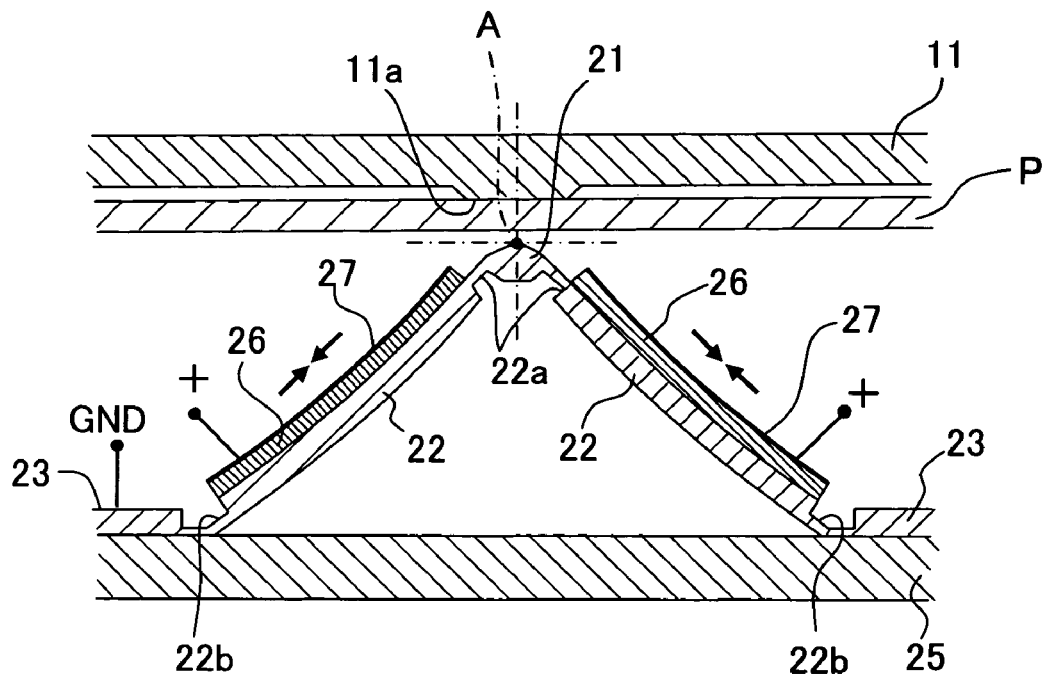
FIG. 4 is a cross-sectional view of the actuator element when a contact section is at a stand-by position.
Figure 5:
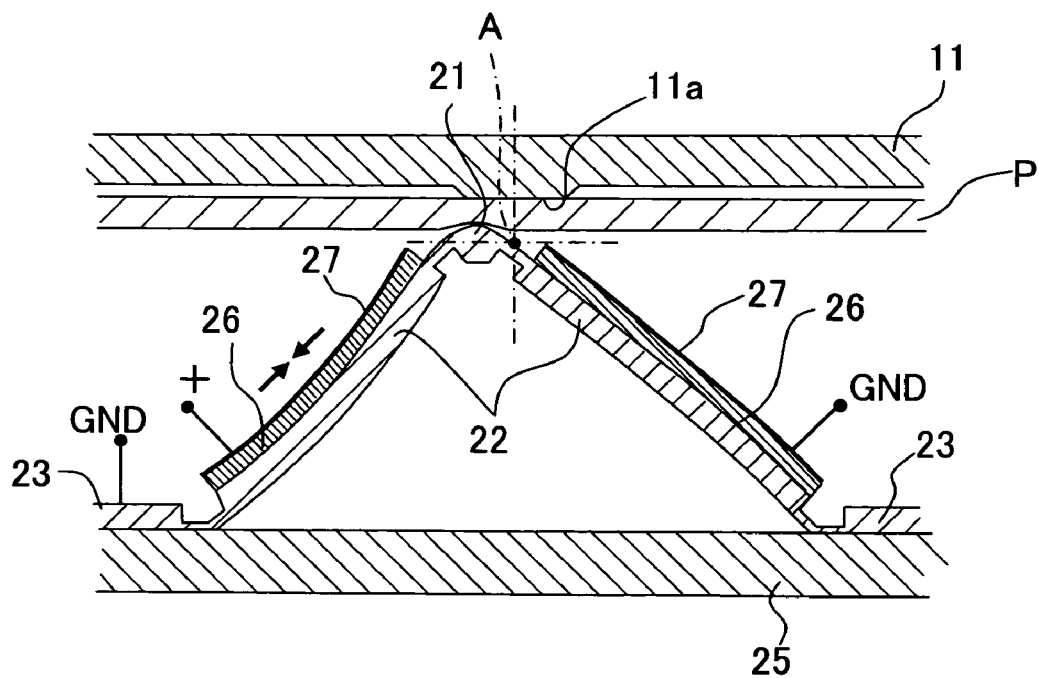
FIG. 5 is a cross-sectional view of the actuator element when the contact section is at a transporting-preparation position.
Figure 6:
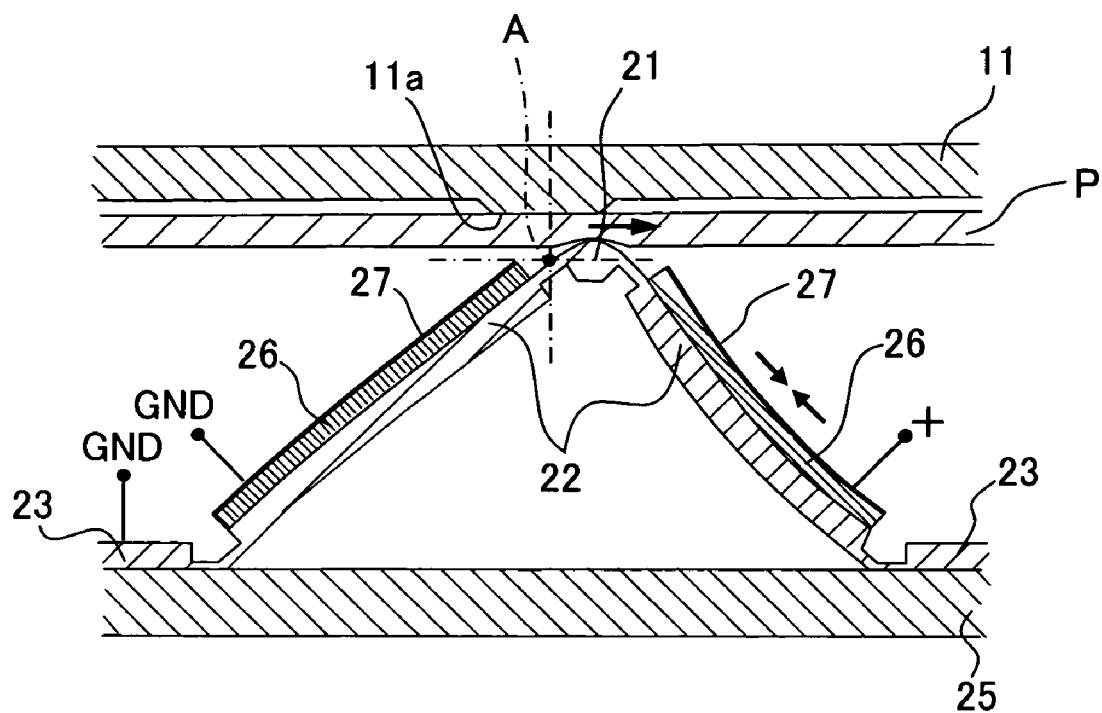
FIG. 6 is a cross-sectional view of the actuator element when the contact section is at a transporting-end position.

Therefore, as shown in FIGS. 4 to 6, by applying the drive voltage by the drive circuit on both or any one of the individual electrodes 27 of one actuator element 10 to deform the inclined section or sections 22 in a bending or bowing manner, it is possible to move the contact section 21 by a minute amount (about several tens of μm, for example) in the transporting direction (towards right side in FIG. 4 to FIG. 6). In FIGS. 4 to 6, "+" denotes a state when the drive voltage is applied and "GND" denotes a state when the ground potential is maintained (state when no drive voltage is applied).

To start with, in a state when the drive voltage is not applied to any of the two individual electrodes 27, the two inclined sections 22 are not deformed. The contact section 21 between these two inclined sections 22 is at a position projecting upwardly over a position of an under surface of the paper P (see FIG. 3A), and when the paper P is transported or conveyed, the contact section 21 cannot be switched to this state (in other words, when the paper P is transported, the voltage is applied to at least one of the two individual electrodes 27 of each of the actuator elements 10). From this state, as shown in FIG. 4, when the drive voltage is applied to both of the individual electrodes 27, both of the inclined sections 22 are deformed so as to project inwardly, and the contact section 21 moves to a position where the contact section 21 does not make a contact with the paper P (stand-by position). A point of intersection A of two chain lines denotes a position of a tip of the contact section 21 while at the stand-by position.

On the other hand, as shown in FIG. 5, when the drive voltage is applied only to the individual electrode 27 on an upstream side in the transporting direction (left side in FIG. 5), only the inclined section 22 on the upstream side in the transporting direction is deformed so as to project inwardly. Therefore, the contact section 21 moves to a position (transporting-preparation position) at which the contact section 21 can make a contact with the paper P and which is positioned on the upstream side (left side) of the stand-by position in the transporting direction. Further, as shown in FIG. 6, when drive voltage is applied only to the individual electrode on the downstream side in the transporting direction (right side in FIG. 6), only the inclined section 22 on the downstream side in the transporting direction is deformed so as to project inwardly. Therefore, the contact section 21 moves to a position (transporting-end position) at which the contact section can make a contact with the paper P and which is positioned on the downstream side of the stand-by position in the transporting direction (right side).

The actuator element 10 is capable of transporting the paper P, which is in contact with the contact section 21, by a minute feed amount in the transporting direction, by moving the contact section 21 in an order of the stand-by position (FIG. 4), then to the transporting-preparation position (FIG. 5), then to the transporting-end position (FIG. 6), and then to stand-by position (FIG. 4). When the contact section 21 is moved from the transporting-end position to the transporting-preparation position, the contact section 21 is once returned from the transporting-end position to the stand-by position at which the contact section 21 does not make a contact with the paper P. Therefore, the paper P and the contact section 21 do not make a contact and the paper P can be transported smoothly.

Figure 3B:
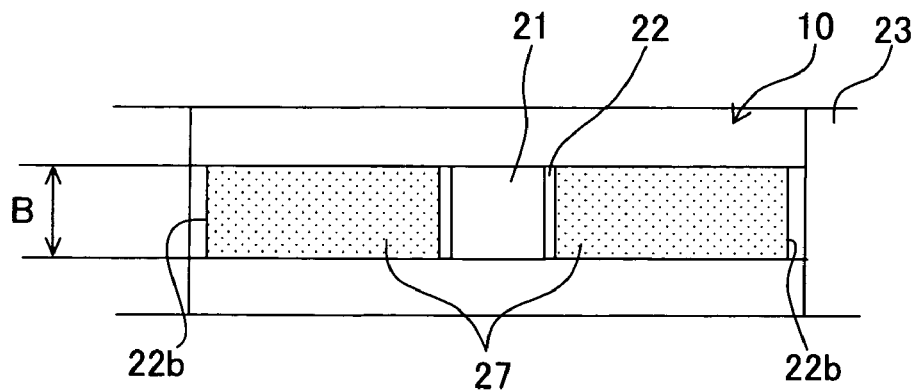

As shown in FIG. 3, grooves 22a are formed each in a lower surface side of an edge of each of the inclined sections 22 on a side of the contact section 21, and grooves 22b are formed each in an upper surface side of an edge of each of the inclined sections 22 on a side of the base section 23. The stiffness of the drive section 20 is lowered partially at the grooves 22a and 22b. Therefore, between the inclined sections 22 and the contact section 21, and between the inclined sections 22 and the base sections 23, the deformation bending of the drive section 20 is easily caused, and thus it is possible to displace the contact section 21 even with a low voltage, thereby improving the driving efficiency of the actuator element 10. In addition, as will be explained later, the drive section 20 is easily bent when the contact section 21 and the two inclined sections 22 are formed by bending the drive section 20.

Further, as described earlier, the upper surface of the contact section 21 is roughened. Accordingly, when the contact section 21 is moved in the transporting direction with the contact section 21 being in contact with the paper P, the frictional force acting between the paper P and the contact section 21 is increased. Therefore, the paper P hardly slips on the contact section 21 and can be transported assuredly by the contact section 21.

As shown in FIGS. 2 to 6, the guide member 11 is arranged horizontally above the plurality of actuator elements 10 to face the actuator elements 10. The guide member 11 has guide sections 11a. Each of the guide sections 11a is formed to face one of the contact sections 21 of the plurality of actuator elements 10, and each of the guide sections 11a is formed to project towards one of the contact sections 21, so as to guide the paper P which is transported in the transporting direction by the contact section 21. Therefore, the paper P can be guided and transported while being pinched from both the upper and the lower sides by the contact section 21 and the guide section 11a projecting towards the contact section 21. Thus, it is possible to transport the paper P stably in the transporting direction.

Figure 7A:
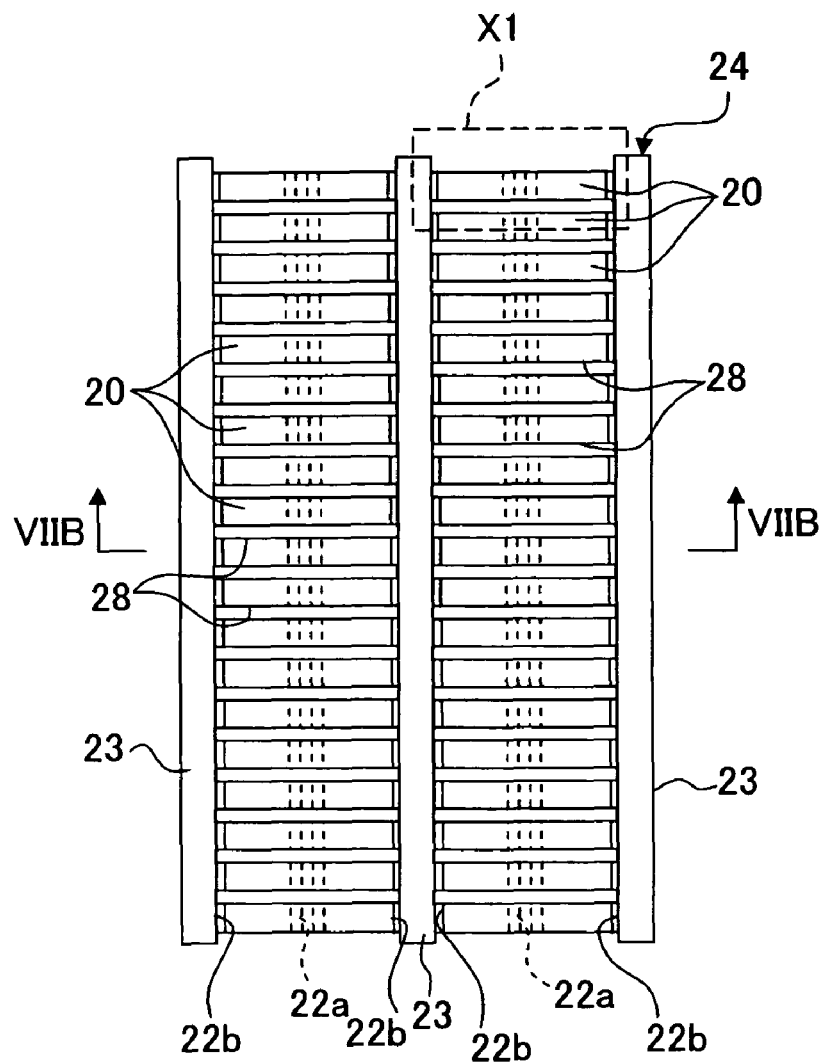
Figure 7B:
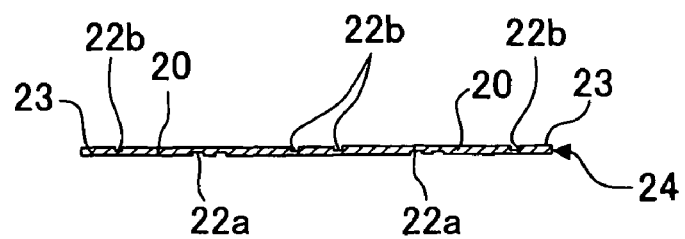

Next, a method of producing the piezoelectric actuator 5 will be explained with reference to FIGS. 7 to 12. First, as shown in FIG. 7, a plurality of drive sections 20 aligned along the scanning direction (up and down direction in FIG. 7A (second direction)) are formed in a divided manner in a metallic plate-shaped member 24, by forming, with a method such as etching processing, a plurality of slits 28 extending in the transporting direction (left and right direction in FIG. 7A (first direction)) in the metallic plate-shaped member 24 (drive section forming step). At this time, the slits 28 are formed such that the slits 28 do not extend up to the both end portions of the plate-shaped member 24 in the left and right directions in FIG. 7A. In other words, the slits 28 are formed such that the slits 28 are divided by base sections 23 extending in the up and down direction, and that each of the drive sections 20 is formed such that the drive section 20 is connected, at its both ends in the left and right direction, to other drive sections 20 which are adjacent to the drive section 20 in the up and down directions respectively. In addition, with a method such as half etching and/or press processing, grooves 22a are formed at portions in a lower surface (lower surface in FIG. 7B) of each of the drive sections 20, the portions being in the vicinity of the central portion in the left and right direction of the drive section 20; and grooves 22b are formed at portions in an upper surface (upper surface in FIG. 7B), the portions being at both ends in the left and right directions, respectively (groove forming step). Accordingly, portions (portions each of which is between one of the grooves 22a and one of the grooves 22b) which are to be two inclined sections 22a, respectively, of each of the drive sections 20, are formed to have a same length in the left and right direction in FIG. 7A (first direction).

Figure 8A:
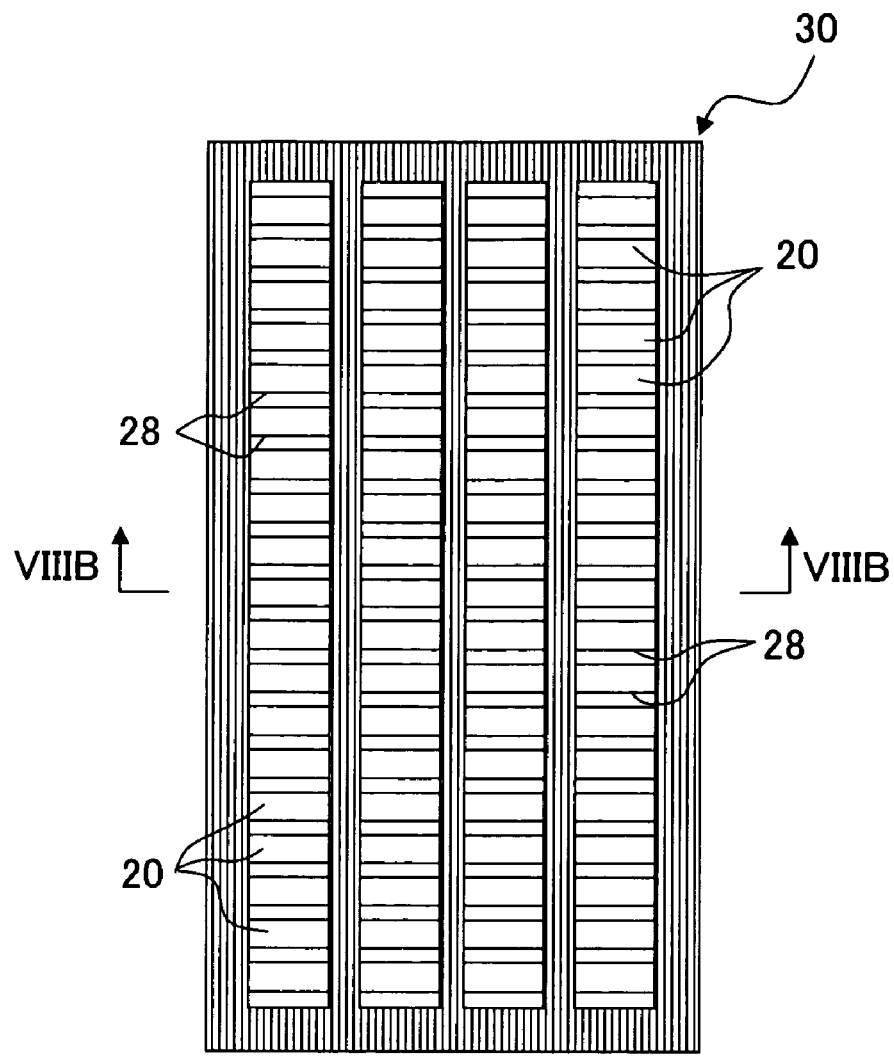
Figure 8B:
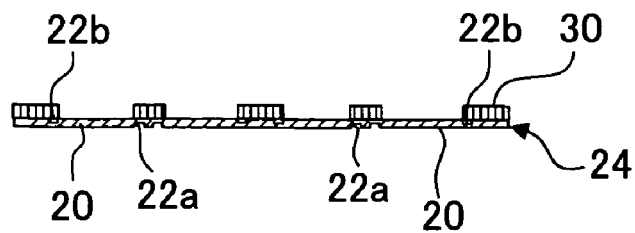
Figure 9A:
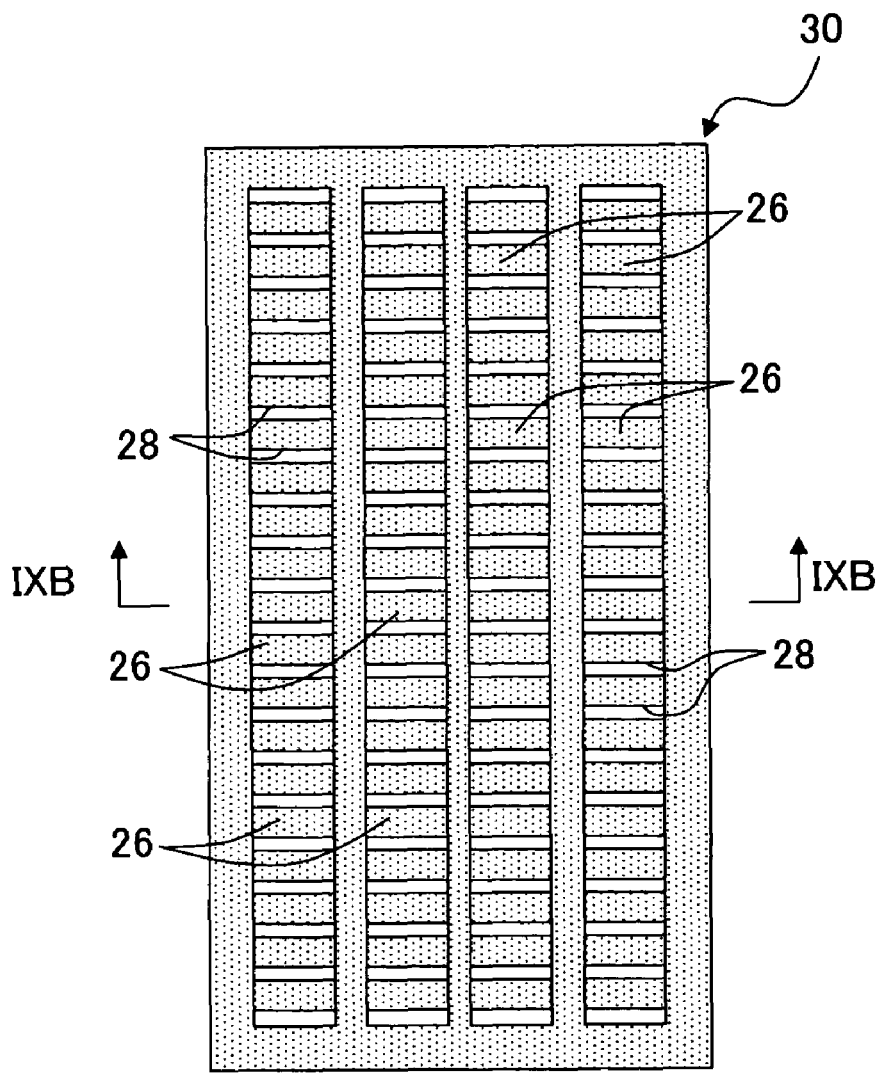
Figure 9B:
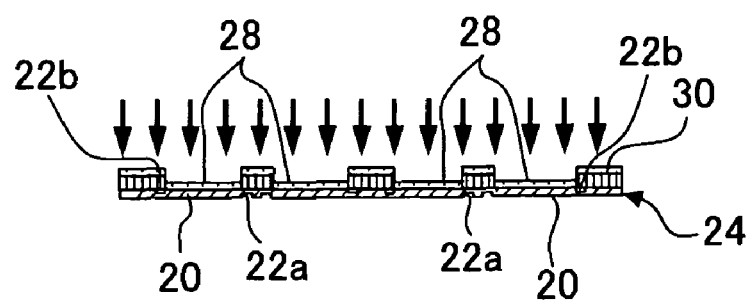

Next, as shown in FIGS. 8A and 8B, a mask 30 is placed on the upper surface of the plate-shaped member 24. The mask 30 covers an area which is outside of the area formed with the drive sections 20 and slits 28 and which include the base sections 23, and covers the central portions (portions to be the contact sections 21) of the drive sections 20. At this time, as shown in FIG. 8B, the portions of the plate-shaped member 24 formed with the grooves 22b are also covered by the mask 30. Next, as shown in FIGS. 9A and 9B, piezoelectric layers 26 are formed at portions (portions which are to be the inclined sections 22), of each of the drive sections 20, which are other than the central portion and the portions of the drive section 20 formed with the grooves 22b, by depositing particles of a piezoelectric material such as PZT onto the upper surface of the plate-shaped member 24 (piezoelectric layer forming step).

Figure 10A:
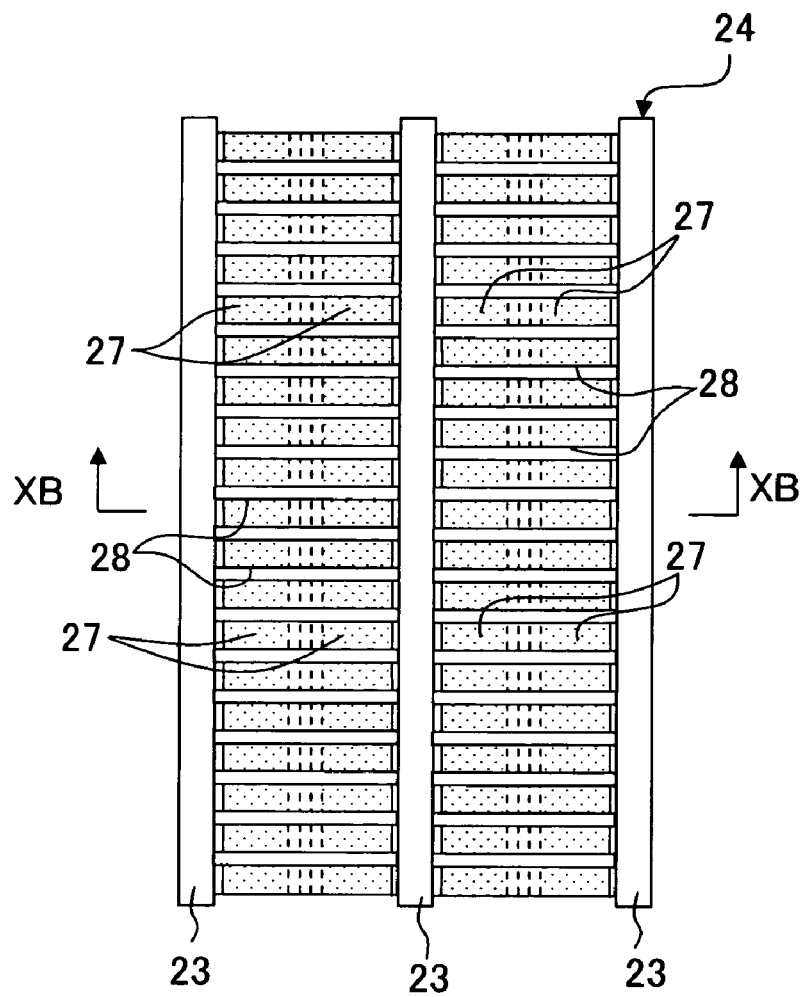
Figure 10B:
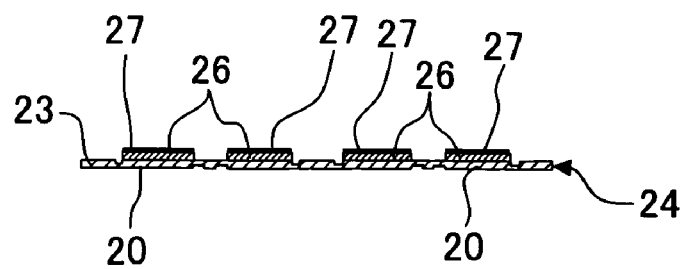

As a method for depositing the particles of piezoelectric material onto the plate-shaped member 24, it is possible to use, for example, an aerosol deposition method (AD method) in which very fine particles of a piezoelectric material are blown onto a substrate to be collided to the substrate (base-plate member 24) at a high velocity and to be deposited onto the substrate. Alternatively, the piezoelectric layers 26 can be formed by a method such as a sputtering method and a chemical vapor deposition method (CVD method). In this manner, when the particles of piezoelectric materials are deposited onto the upper surface of the plate-shaped member 24 by the AD method, the sputtering method or the CVD method, the particles are not deposited onto the inner surfaces, of the plate-shaped member 24, which defines the slits 28. In other words, there is no need to use a mask having a complicated configuration for covering each of the slits 28 so that the piezoelectric layers 26 are not formed at the portions formed with the slits 28. Accordingly, by using the mask 30 having a relatively simple configuration as shown in FIGS. 8 and 9, the piezoelectric layers 26 can be formed only on the upper surfaces of the both side portion (portions which are to be the inclined sections 22) in the left and right direction of each of the drive sections 20, thereby making it easy to form the piezoelectric layers 26 in the drive sections 20. Subsequently, as shown in FIG. 10, after removing the mask 30 from the plate-shaped member 24, then a plurality of individual electrodes 27 are formed on the upper surfaces of the piezoelectric layers 26 respectively, with a method such as screen printing method (individual electrode forming step). Alternatively, the individual electrodes 27 can be formed with the sputtering method or the like. In this case, the mask 30 also serves as a mask for sputtering, the individual electrodes 27 may be formed in a state that the mask 30 is attached, and the mask 30 may be removed after the formation of individual electrodes.

Figure 11A:
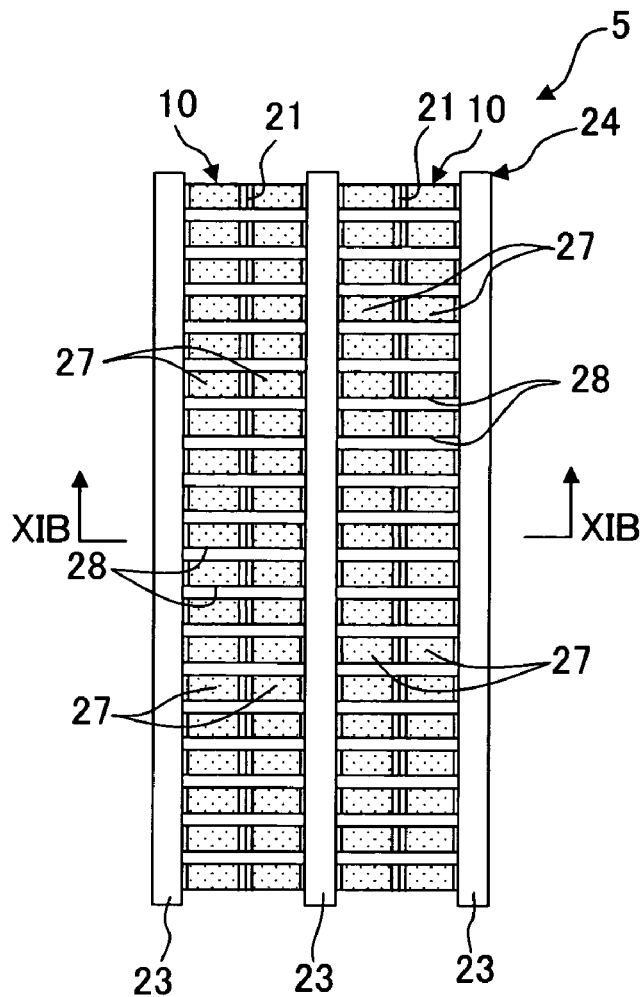
Figure 11B:
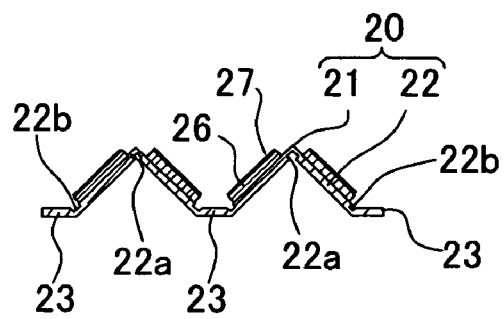

Next, as shown in FIG. 11, the central portion and the both end portions in the left and right direction of each of the drive sections 20 are bent with a press processing or the like to cause the central portions of the plate-shaped member 24 in which the piezoelectric layers 26 are not formed to project upward (in the direction orthogonal to the plane direction of the plate-shaped member 24), thereby forming the contact sections 21 and the inclined sections 22 (bending step). Here, since the plate-shaped member 24 is a metallic plate, the bending can be easily performed by the press processing or the like. In addition, the grooves 22a are formed in the lower surface of the central portion of the drive section 20 and the groove 22b are formed in the upper surfaces of the both end portions of the drive section 20 respectively in the groove forming step as described above, and the piezoelectric layers 26 are not formed in the grooves 22b formed in the upper surface. Accordingly, the drive section 20 can be bent further easily at the central portion and the both end portions. In addition, since the drive sections 20 are aligned in the direction (second direction) which is orthogonal to the direction (first direction) in which the drive sections 20 extend, the grooves 22a formed in each of the drive sections 20 are located in a same position with respect to the first direction, and the grooves 22b formed in each of the drive sections 20 are located in a same position with respect to the first direction. Accordingly, since the grooves 22a, 22b are aligned along the second direction, the drive sections 20 can be easily bent in sequence or at once.

According to the piezoelectric actuator 5 and the method for producing the piezoelectric actuator of the first embodiment as explained above, the following effects can be obtained. The actuator elements 10, of the piezoelectric actuator 5 of the first embodiment, has the plurality of drive sections 20 bent so as to project in the direction orthogonal to the plane direction of the plate-shaped member 24; and the piezoelectric layers 26 arranged in the inclined sections 22 respectively of each of the drive sections 20. Accordingly, it is possible to transport the paper P which is contact with the contact section 21 of each of the drive sections 20 by a minute feed amount, by making the electric field acting in the piezoelectric layer 26 in its thickness direction to form the piezoelectric layer 26.

Further, upon producing the piezoelectric actuator 5, the drive sections 20 are defined by forming the slits 28 in the plate-shaped member 24; then the piezoelectric layers 26 are formed in the drive sections 20 by depositing the particles of piezoelectric material onto the upper surface of the plate-shaped member 24; and then the contact sections 21 and the inclined sections 22 are formed by bending the drive sections 20. In this case, when the particles of piezoelectric material are deposited onto the upper surface of the plate-shaped member 24, the particles are not deposited in the portions of the plate-shaped member 24 at which the slits 28 are formed. Accordingly, it is possible to easily form the piezoelectric layers 26 in the plate-shaped member 24 only on the upper surfaces (portions which are to be the inclined sections 22) of each of the drive sections 20. Accordingly, the piezoelectric actuator 5 which has the bent-shaped drive sections 20 and the piezoelectric layers 26 arranged at the inclined sections 22 of each of the drive sections 20, and which is capable of realizing transport by a minute amount utilizing the bending of the drive sections 20, can be produced easily, thereby lowering the production cost.

In addition, since the piezoelectric layers 26 are formed before performing the bending step in which the drive sections 20 are bent, the particles of piezoelectric material can be deposited onto the flat, upper surfaces of the drive sections 20. Accordingly, the piezoelectric layers 26 having a uniform thickness can be formed easily. In this embodiment, although the grooves 22a are formed at both sides in the lower surface of the contact section 21 respectively, the grooves 22a may be formed as one groove which span across the entire lower surface of the contact section 21.

Next, modified embodiments, in which various modifications are added to the first embodiment described above, will be explained. Same reference numerals will be used for components which have a structure similar to those in the first embodiment described above and the description of these similar components will be omitted as deemed appropriate.

First Modified Embodiment

In the above first embodiment, the drive sections 20 are bent such that the central portions of the drive sections 20 (portions which are to be the contact sections 21) project in the direction orthogonal to the plane direction of the plate-shaped member 24. However, the central portions may project in a direction which is inclined to some extent with respect to the direction orthogonal to the plate direction, provided that the inclined direction is different from the plane direction. In other words, in the first embodiment, the central portion (contact section 21) of each of the drive sections 20 is formed such that the central portion projects toward the direction orthogonal to the plane direction of the plate-shaped member 24, because the portions of each of the drive sections 20, which are to be the two inclined sections 22, are same in length in the extending direction of the slit 28 (first direction). However, the direction in which the central portion protrudes may be inclined to some extent from the direction orthogonal to the plane direction of the plate-shaped member 24, by bending each of the drive sections 20 at a position deviated or shifted to one side from the center of the first direction so as to form two inclined sections 22 which are mutually different in length with respect to the first direction.

Second Modified Embodiment

In the first embodiment, although the drive sections 20 are bent after forming the piezoelectric layers 26 on the upper surfaces of the drive sections 20 (see FIG. 11), the piezoelectric layers 26 may be formed by depositing the particles of piezoelectric material onto the surface of the plate-shaped member 24 after bending the drive sections 20.

Third Modified Embodiment

Figure 12:
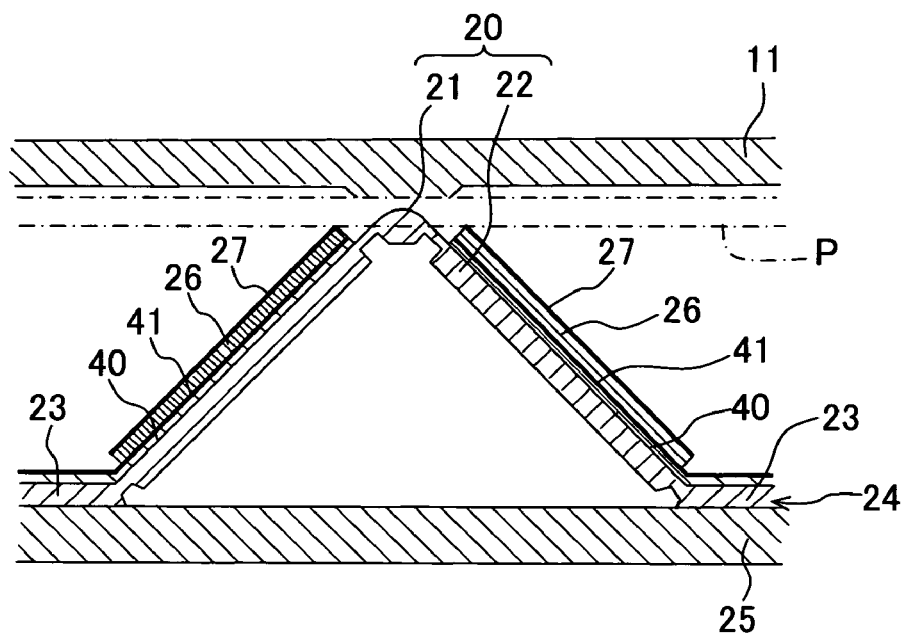
FIG. 12 is a cross-sectional view of a modified embodiment of the first embodiment, corresponding to FIG. 3A.

In the first embodiment, the metallic inclined sections 22 serve as a common electrode, and the electric field is applied to the piezoelectric layer 26 sandwiched between the inclined section 22 and the individual electrode 27 by applying voltage between the inclined section 22 and individual electrode 27. However, a common electrode may be provided separately from the inclined section 22. For example, when the plate-shaped member 24 is made of a metallic material, as shown in FIG. 12, an insulating layer 40 made of an insulating material may be formed on upper surfaces of the drive sections 20 and base sections 23 in the plate-shaped member 24, and a common electrode 41 may be formed on the upper surface of this insulating layer 40. Alternatively, the plate-shaped member 24 can be formed of an insulating material. In this case, no insulating layer 40 is required, and the common electrode 41 is formed directly on the upper surface of the plate-shaped member 24.

Fourth Modified Embodiment

Figure 13:
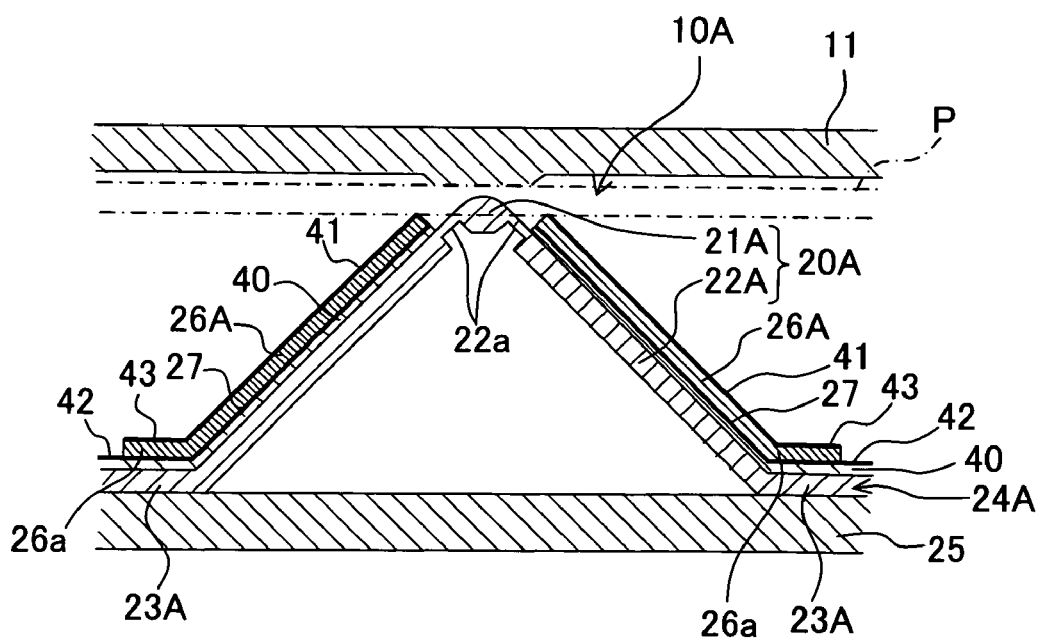
FIG. 13 is a cross-sectional view of another modified embodiment of the first embodiment, corresponding to FIG. 3A.

The individual electrode 27, to which the drive voltage is applied, may be arranged on the lower surface of the piezoelectric layer, and the common electrode 41, which is kept at ground potential, may be arranged on the upper surface of the piezoelectric layer. For example, as shown in FIG. 13, insulating layers 40 made of an insulating material may be formed on the upper surface of a metallic plate-shaped member 24A, individual electrodes 27 and wirings 42 connected to the individual electrodes 27 respectively may be formed on the upper surfaces of the insulating layers 40 (on the lower surfaces of piezoelectric layers 26A) respectively, and common electrodes 41 may be formed on the upper surfaces of the piezoelectric layers 26A respectively. Each of the piezoelectric layers 26A extends, from the left or right end of each of drive sections 20A, further up to the upper surface of a base section 23A, and a plurality of common electrodes 41 aligned in a direction orthogonal to the sheet surface of FIG. 13 are connected with each other via a conductive layer 43 formed the surface of this portion of the piezoelectric layer 26A extending up to the base section 23A (hereinafter referred also to as "piezoelectric base section 26a").

Figure 14A:
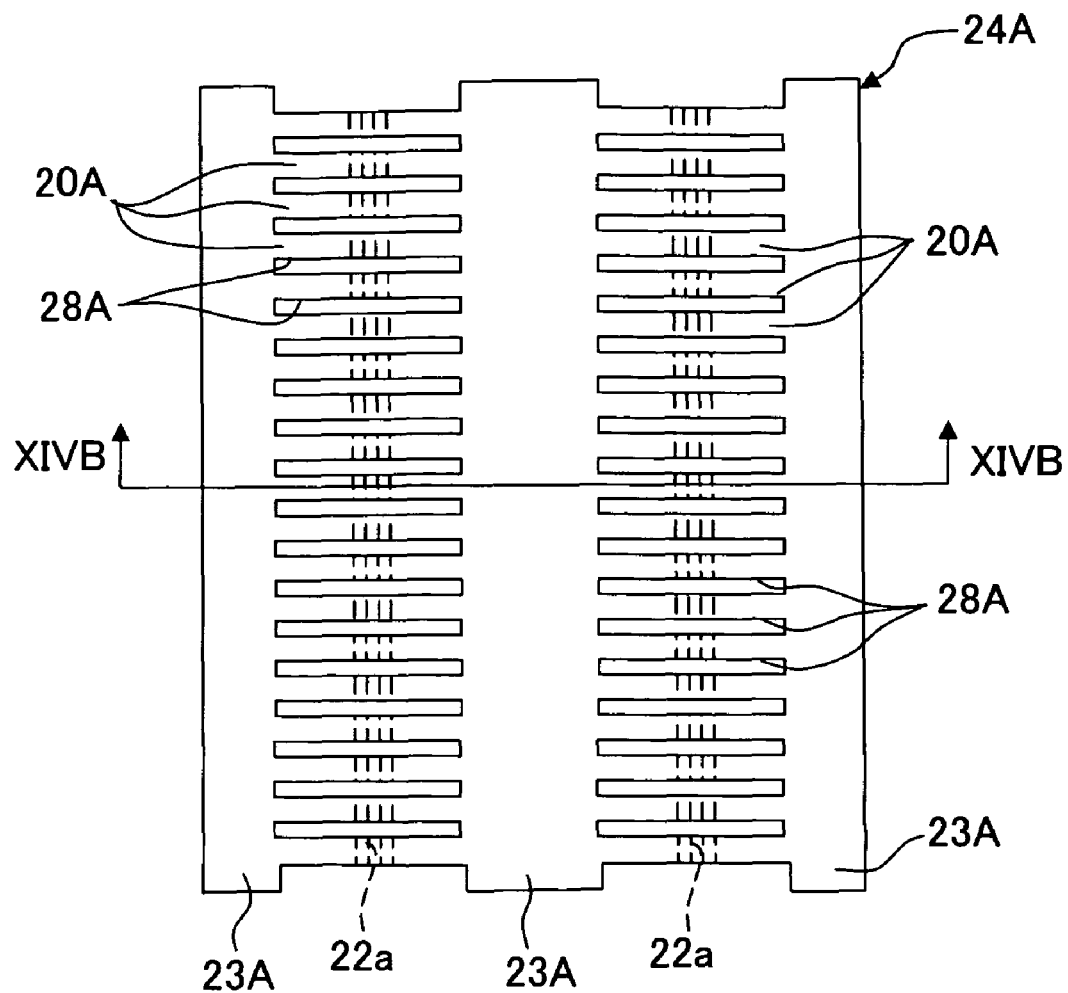
Figure 14B:
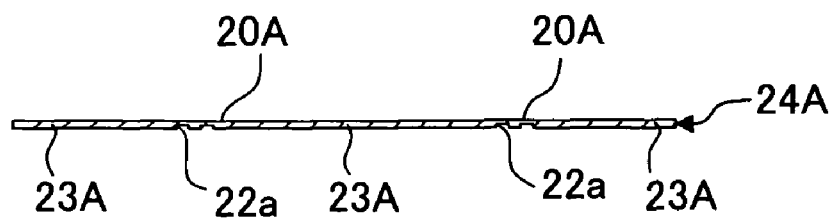

A method of producing a piezoelectric actuator 5A which has actuator elements 10A as shown in FIG. 13 will be explained with reference to FIGS. 14A to 20B. First, as shown in FIGS. 14A and 14B, a plurality of drive sections 20A aligned along the scanning direction (up and down direction in FIG. 14A) are defined in the metallic plate-shaped member 24 by forming, by etching processing or the like, a plurality of slits 28A extending in the transporting direction (left and right direction in FIG. 14A) in the metallic plate-shaped member 24A (drive section forming step). In addition, grooves 22a are formed, by a method such as half-etching and press processing, at portions in the lower surface of each of the drive sections 20A, the portions being in the vicinity of the central portion in the left and right direction of the drive section 20A (groove forming step). The grooves 22a are for facilitating the bending of the drive sections 20A in a bending step as will be explained later. In the fourth modified embodiment, the piezoelectric layer 26A (piezoelectric base section 26a) is formed in an area ranging from each of the drive sections 20 to a base section 23A. Accordingly, unlike in the first embodiment, no grooves are formed in the upper surface at both ends of each of the drive sections 20A.

Figure 15A:
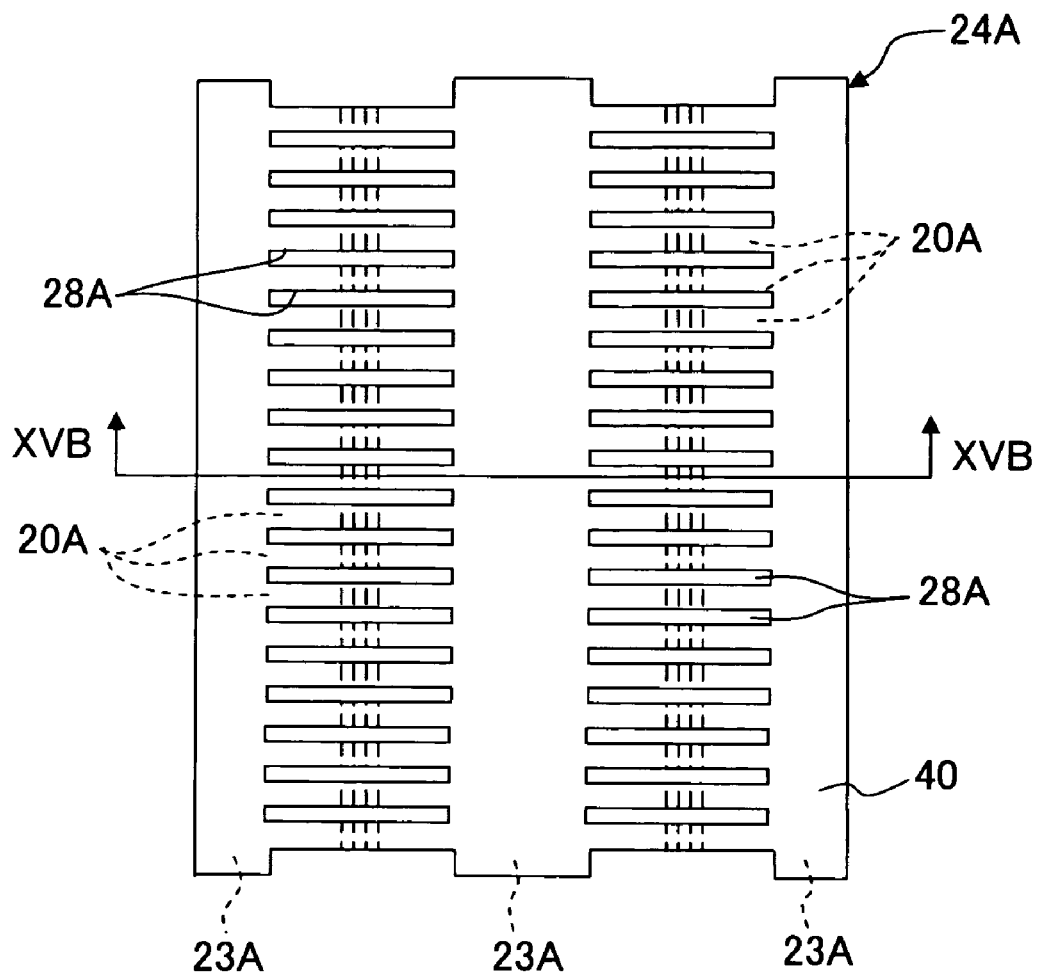
Figure 15B:
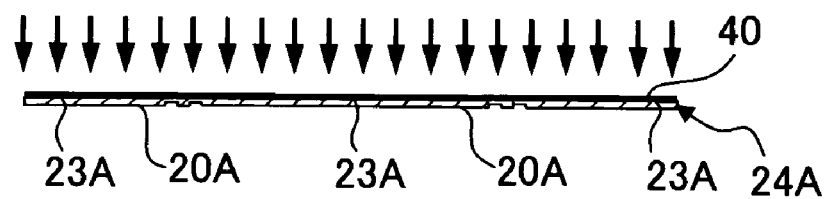
Figure 16A:
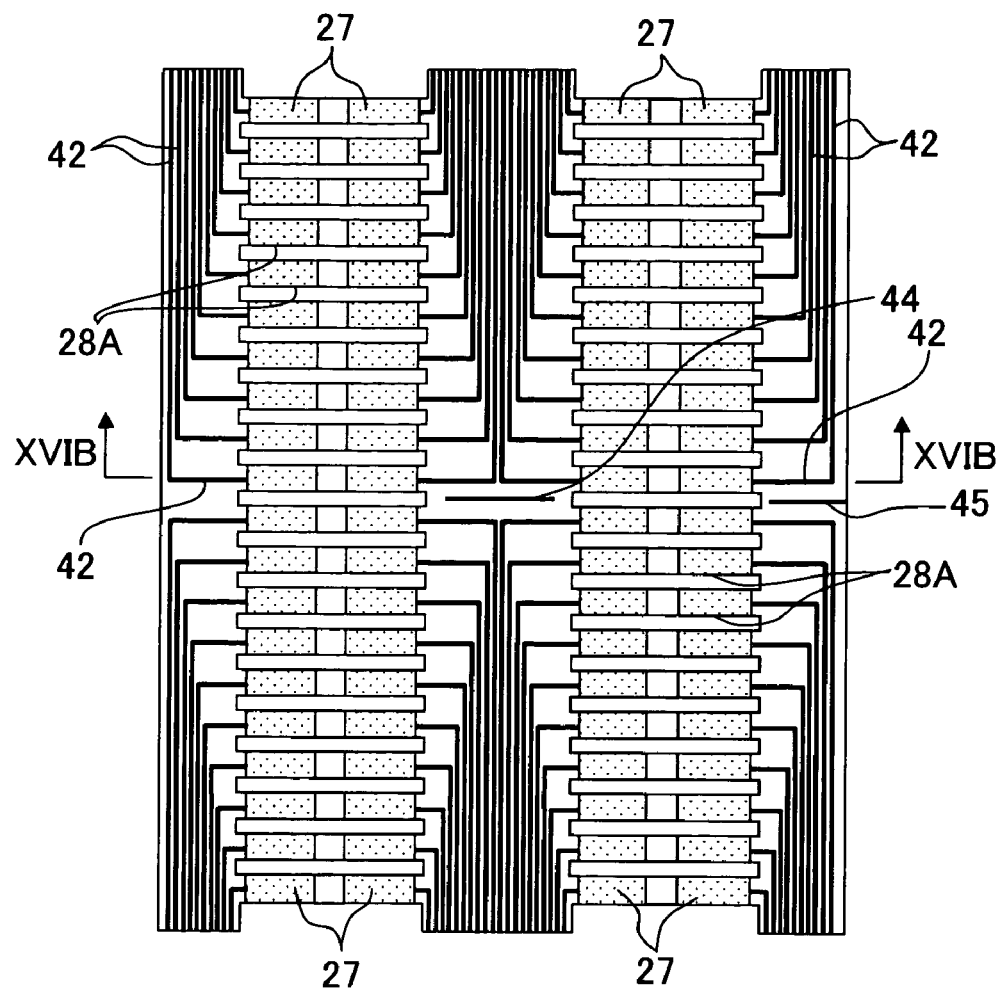
Figure 16B:
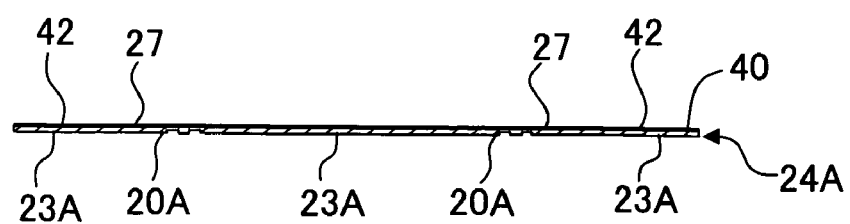

Next, as shown in FIGS. 15A and 15B, an insulating layer 40 formed of an insulating ceramic material such as alumina or zirconia is formed on the upper surface of the plate-shaped member 24 with a method such as the AD method, the sputtering method or the CVD method (insulating layer forming step). Then, as shown in FIGS. 16A and 16B, two individual electrodes 27 are formed in portions (portions which are to be inclined sections 22A), of the surface of the insulating layer 40, respectively, the portions being on both left and right sides of each of the drive sections 20A and other than the central portions of the drive section 20A (individual electrode forming step). At this time, a plurality of wirings 42 connected to the individual electrodes 27 respectively are also formed on the surface of portions of the insulating layer 40, the portions being formed in the base sections 23A. Further, wirings 44, 45 for maintaining common electrodes 41 (to be explained later) at ground potential are also formed on the surface of the insulating layer 40. A conductive pattern, configured of the individual electrodes 27 and wirings 42a corresponding to the drive sections 20A respectively and the wirings 44, 45 corresponding to the common electrodes 41, can be formed at a time on the upper surface of the plate-shaped member 24 by screen printing, for example.

Figure 17A:
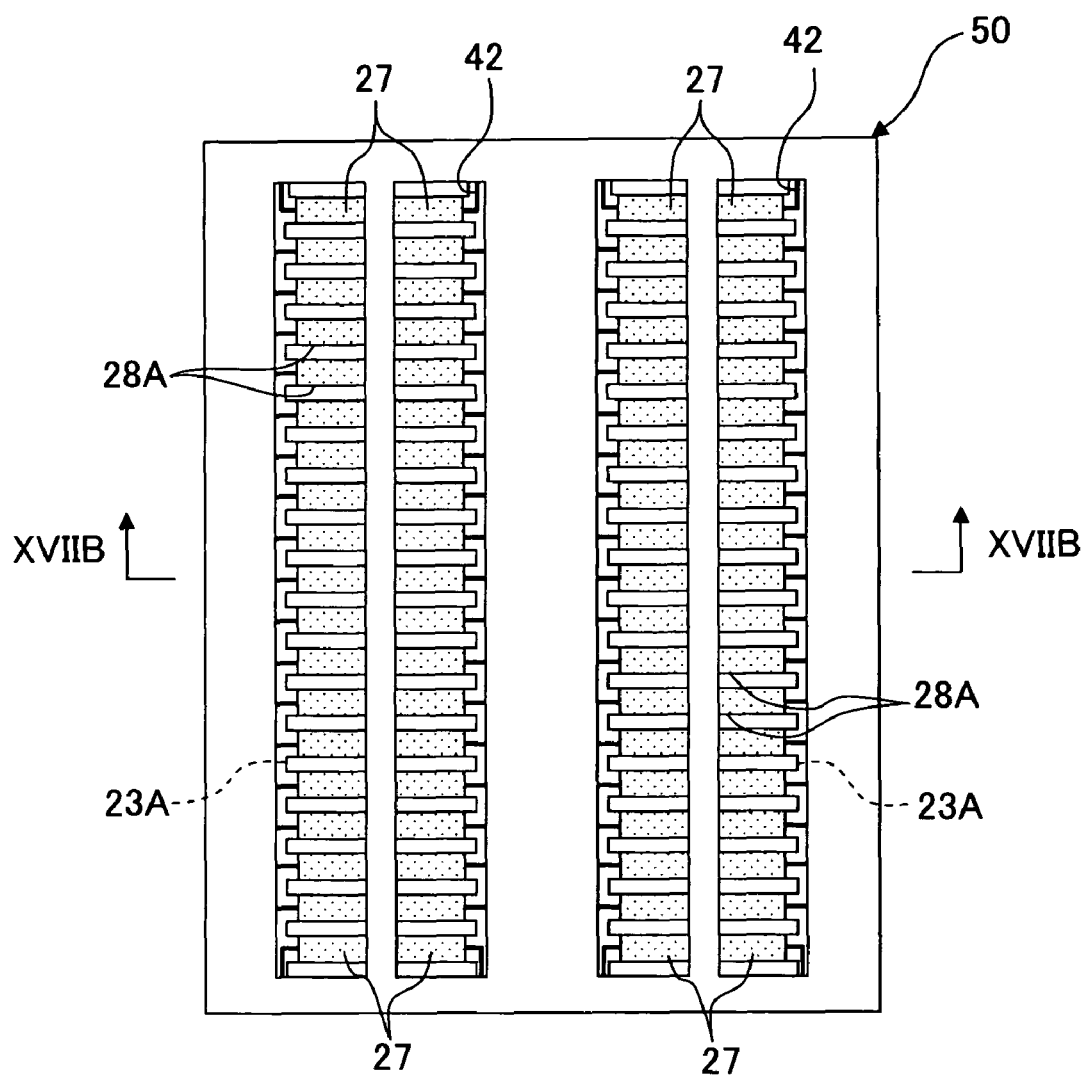
Figure 17B:
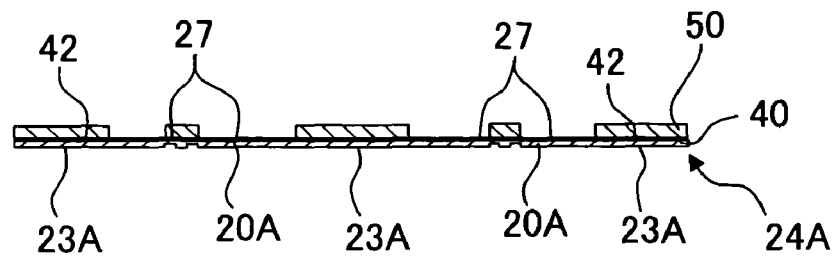

Further, as shown in FIGS. 17A and 17B, a mask 50 is placed on the upper surface of the plate-shaped member 24. The mask 50 covers an area which is outside of the area formed with the drive sections 20A and slits 28A, and covers the central portions (portions to be the contact sections 21A) of the drive sections 20A. Here, as shown in FIG. 17A, a portion of the base section 23A, connected to the drive sections 20A, are not covered by the mask 50.

Figure 18A:
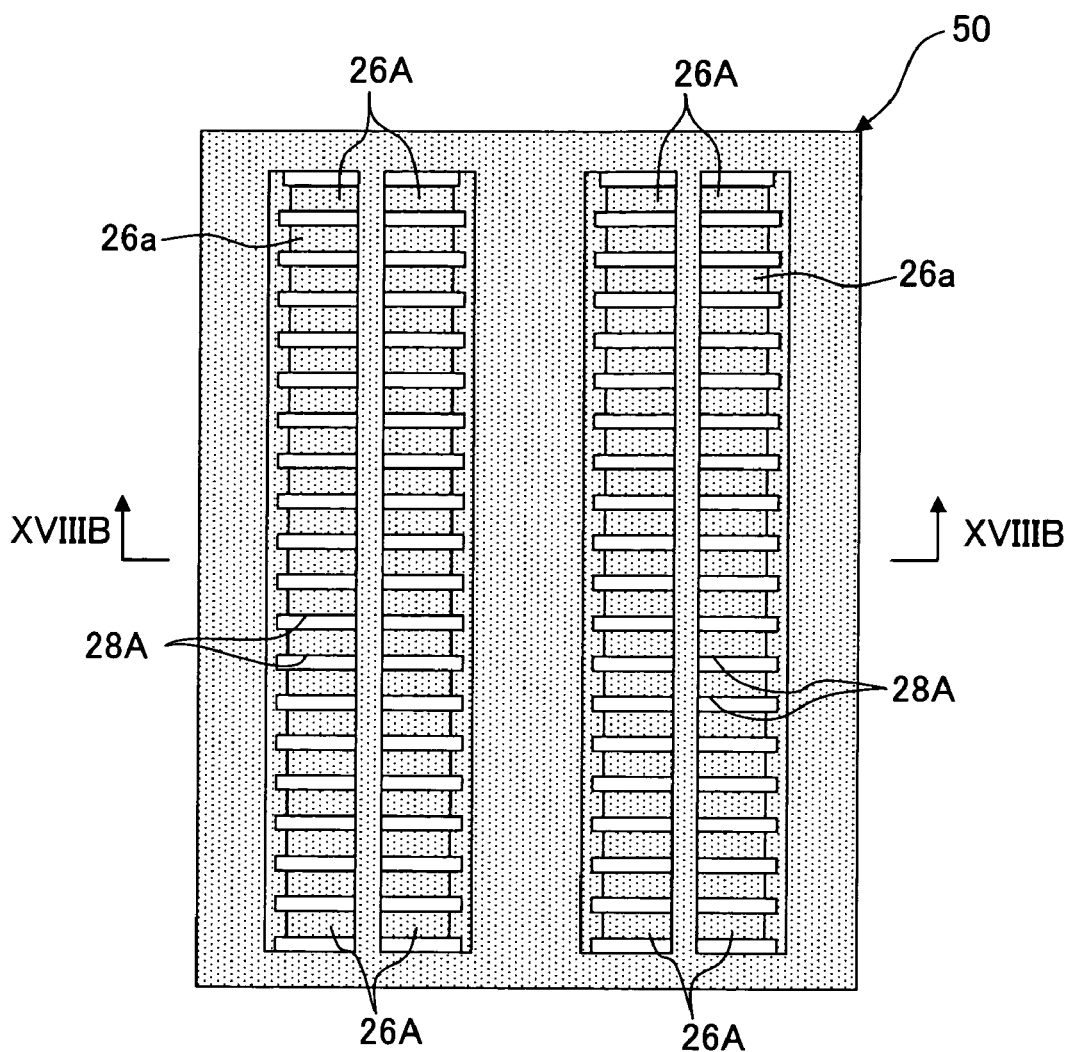
Figure 18B:
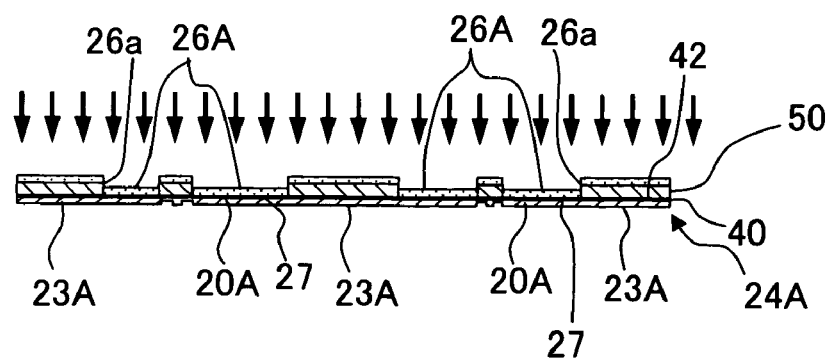

Next, as shown in FIGS. 18A and 18B, piezoelectric layers 26A are formed at portions (portions which are to be the inclined sections 22), of each of the drive sections 20, which are other than the central portions covered by the mask 50, by depositing particles of a piezoelectric material such as PZT onto the upper surface of the plate-shaped member 24A (piezoelectric layer forming step). In this case, since the portions of the base section 23A connected to the drive sections 20A respectively are not covered by the mask 50, the piezoelectric layers 26A (piezoelectric base sections 26a) are also formed in these portions.

Figure 19A:
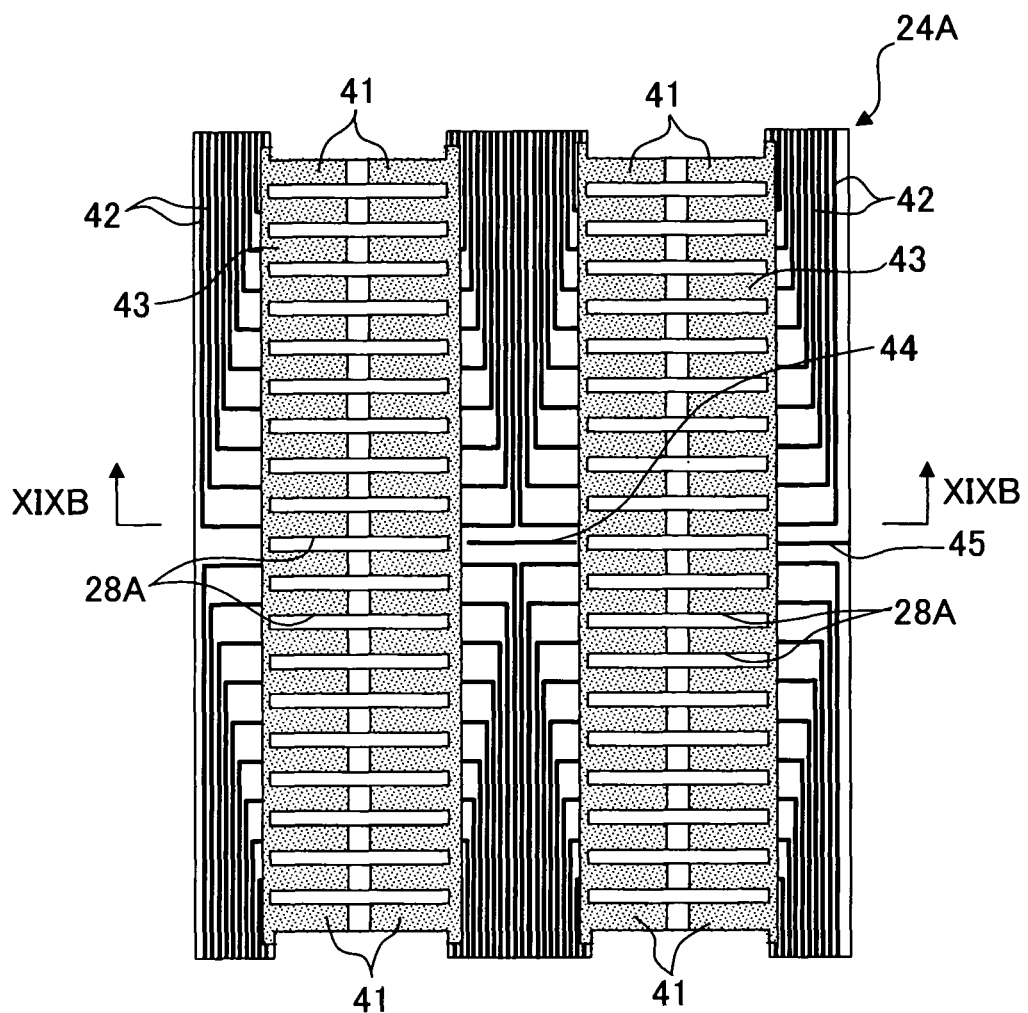
Figure 19B:
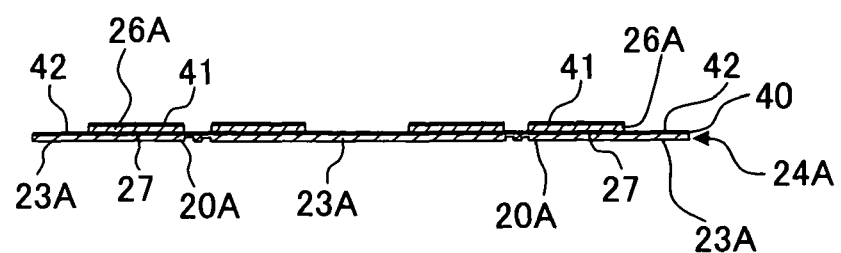
Figure 20A:
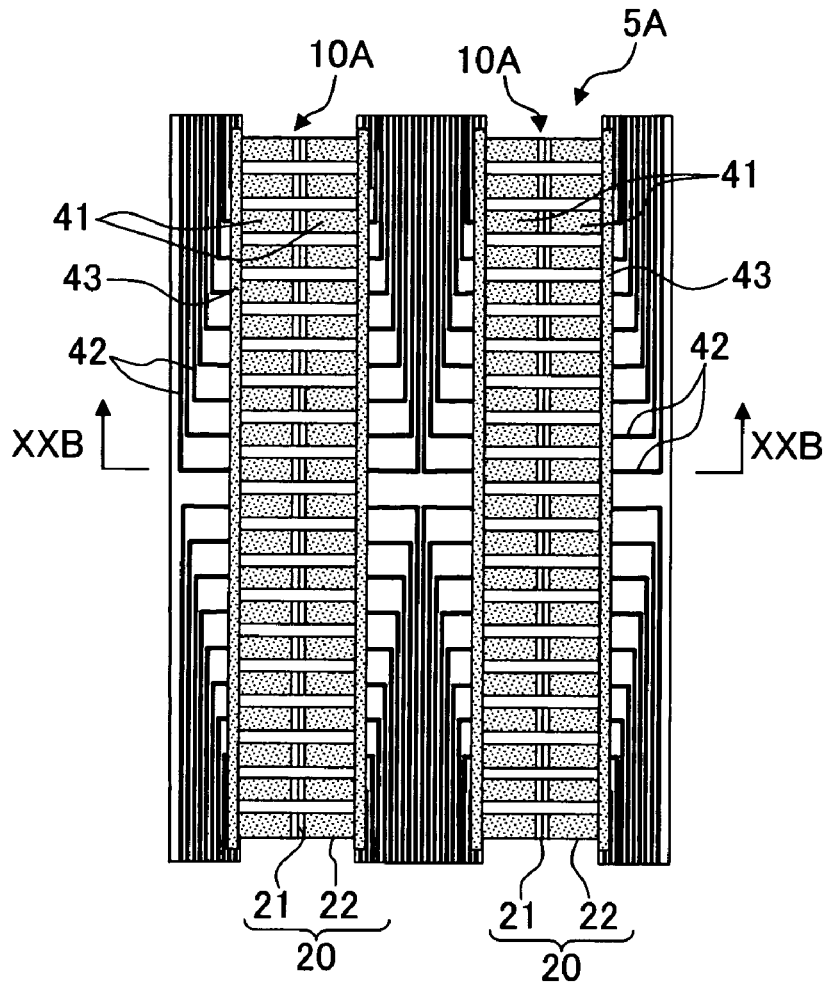
Figure 20B:
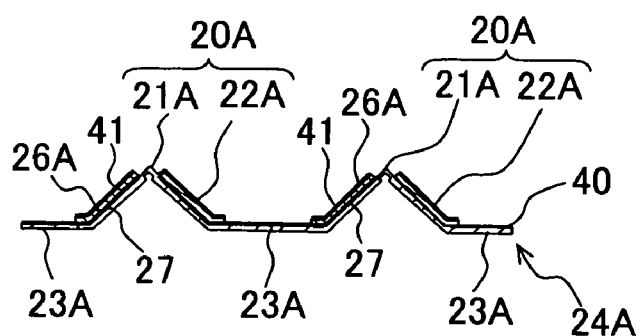

Further, as shown in FIGS. 19A and 19B, after removing the mask 50, common electrodes 41 corresponding to the two individual electrodes 27 respectively are formed, by a method such as screen printing method or the like, on the upper surfaces of the individual electrodes 26A arranged in each of the drive sections 20A (common electrode forming step). Alternatively, since the mask 50 also serves as a mask for sputtering, the common electrodes 41 may be formed in a state that the mask 50 is attached, and the mask 50 may be removed after the formation of common electrodes 41 by the sputtering method or the like. At this time, the conductive layer 43 is also formed on the upper surfaces of the piezoelectric base sections 26a, thereby connecting the common electrodes 41 with each other, the common electrodes 41 corresponding to the individual electrodes 27 respectively and aligned in the scanning direction (up and down direction in FIG. 19A). Further, by connecting and the wirings 44, 45, formed on the upper surface of the insulating layer 40, and the common electrodes 41 with a conductive material, all of the aligned common electrodes 41 are maintained at ground potential via the wirings 44, 45. Furthermore, as shown in FIGS. 20A and 20B, the central portions and the both end portions of the drive sections 20A are bent with a press processing or the like to cause the central portions to project upward, thereby forming the contact sections 21A and the inclined sections 22A (bending step). Thus, the producing process of the piezoelectric actuator 5A is completed.

As shown in FIG. 20A, in this piezoelectric actuator 5A, the wirings 42, which are to be connected to the individual electrodes 27 respectively, can be wired or drawn freely on the upper surface of the plate-shaped member 24A via the insulating layer 40. Accordingly, the wirings 42 are drawn up to the both end portions (both end portion in the up and down direction in FIG. 20A) of the plate-shaped member 24A, and wiring members such as FPC and the wirings 42 can be connected at a time. Thus, the construction for electrical connection is more simplified than a case in which terminals of the FPC or the like are directly connected to the individual electrodes 27 respectively, and the reliability of electrical connection is also improved. Further, when the drive circuit is arranged on the upper surface of the insulating layer 40, it is possible to directly connect the drive circuit and the individual electrodes 27 with the wirings 42 on the upper surface of the insulating layer 40. Accordingly, the number of components can be reduced since the wiring member such as FPC can be omitted. In the fourth modified embodiment, although the grooves 22a are formed at both sides in the lower surface of the contact section 21A respectively, the grooves 22a may be formed as one groove which span across the entire lower surface of the contact section 21A.

Fifth Modified Embodiment

In the first embodiment, the drive sections 20 extending in the first direction corresponding to the transporting direction are aligned along the second direction corresponding to the scanning direction. However, it is not necessarily indispensable that the second direction is orthogonal to the first direction in such a manner, and it is enough that the second direction is different from the first direction.

Figure 21A:
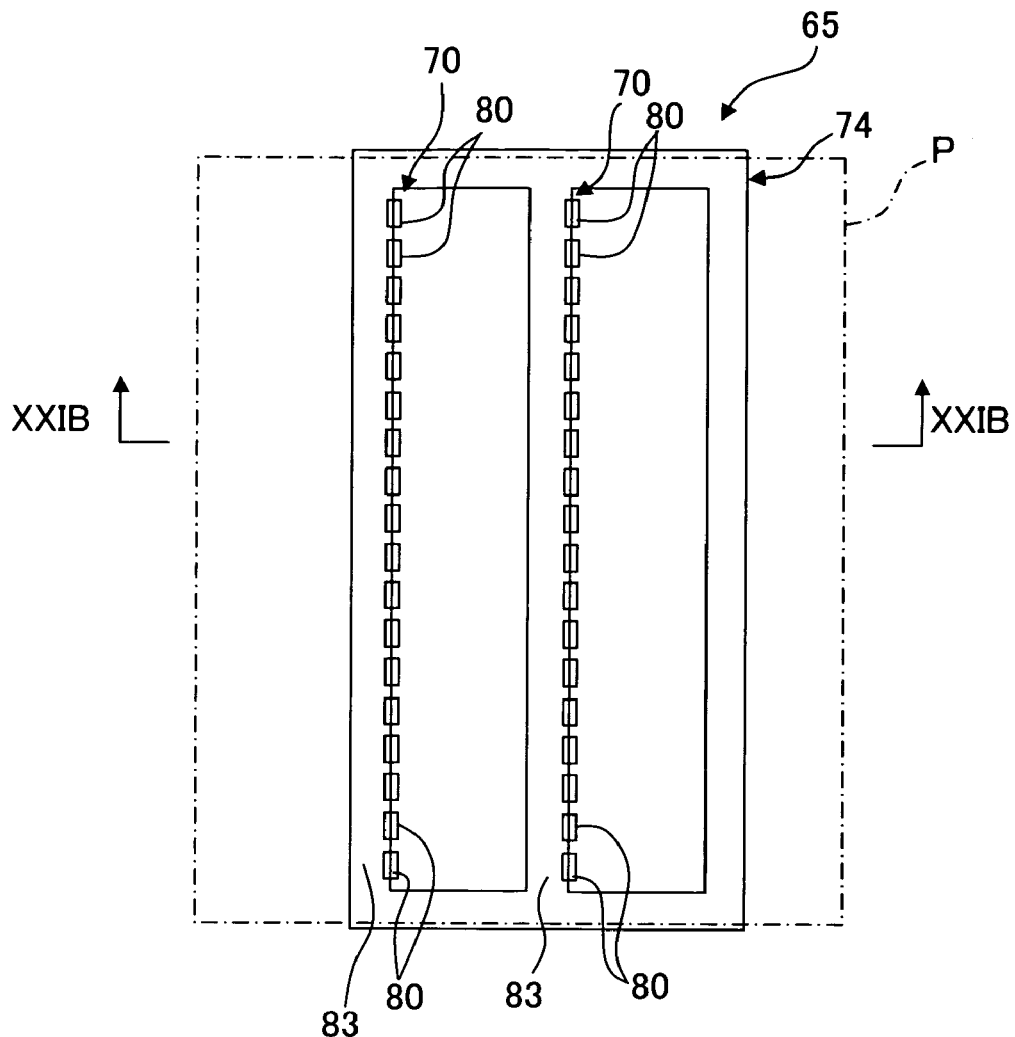
Figure 21B:
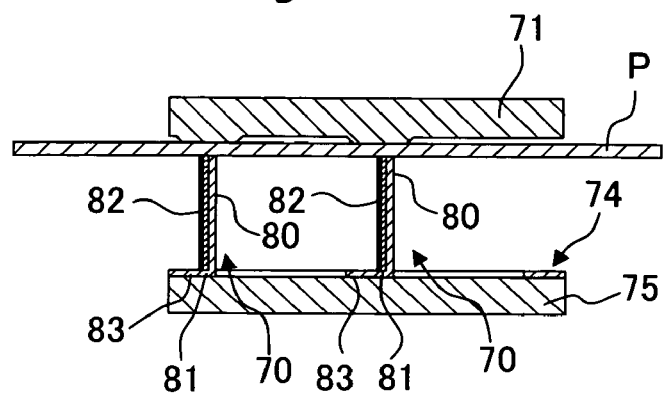

Next, a second embodiment of the present invention will be explained. As shown in FIGS. 21A and 21B, a piezoelectric actuator 65 of the second embodiment has a plurality of actuator elements 70 aligned in two rows, in the scanning direction (up and down direction in FIG. 21A) along the plane of a substrate 75 provided horizontally.

Each of the plurality of actuator elements 70 has a drive section 80 which is formed in a plate-shaped member 74 made of a metallic material, and a drive section 80 of one actuator elements 70 and another drive section 80 of another actuator element 70 adjacent to the drive section 80 in the scanning direction are connected with each other by a base section 83. The drive sections 80 are formed by being bent upwardly by an angle of 90 degrees with respect to the plane of the substrate 75. Namely, the drive sections 80 are bent parallel to a direction orthogonal to the plane direction of the plate-shaped member 74. Each of the drive sections 80 is connected, at one end (left end in FIG. 21A) thereof, to another drive section 80 adjacent thereto in the scanning direction (up and down direction in FIG. 21A), via one of the base sections 83. The base sections 83 are fixed to the horizontal substrate 75.

Piezoelectric layers 81, mainly composed of lead zirconate titanate (PZT) which is a solid solution of lead titanate and lead zirconate and is a ferroelectric substance, are formed on the left side surfaces in FIG. 21B respectively of the drive portions 80 formed in an upright manner. In addition, individual electrodes 82 are formed on the left side surfaces of the piezoelectric layers 81, respectively, and the individual electrodes 82 are connected to a drive circuit (not shown). Each of the metallic driving sections 80 serves also as a common electrode, and is always kept at ground potential.

When the drive voltage is applied to the individual electrode 82 from the driving circuit, there is a difference in electric potential between the individual electrode 82 and the drive section 80 which serves as the common electrode and is maintained at the ground potential, and an electric field is generated in the piezoelectric layer 81 in a direction of thickness thereof, the piezoelectric layer 81 being sandwiched between the individual electrode 82 and the drive section 80. At this time, when the direction in which the piezoelectric layer 81 is polarized is same as the direction of electric field, the piezoelectric layer 81 expands in the thickness direction, and thus contracts in a direction orthogonal to the thickness direction, that is a plane direction of the piezoelectric layer 81. Accordingly, with this contraction of the piezoelectric layer 81, the drive section 80 is deformed so as to bend or bow leftward, thereby displacing a tip portion, as a free end of the drive section, leftward by a minute amount.

In other words, when the drive voltage is applied to an individual electrode 82, the piezoelectric actuator 65 causes the tip portion of the drive section 80, corresponding to this individual electrode 82, to be displaced leftward, and thus the piezoelectric actuator is capable of transporting the paper P which is guided by the guide member 71 by a minute feed amount while supporting the paper P from below with the tip portion of the drive section 80.

Figure 22A:
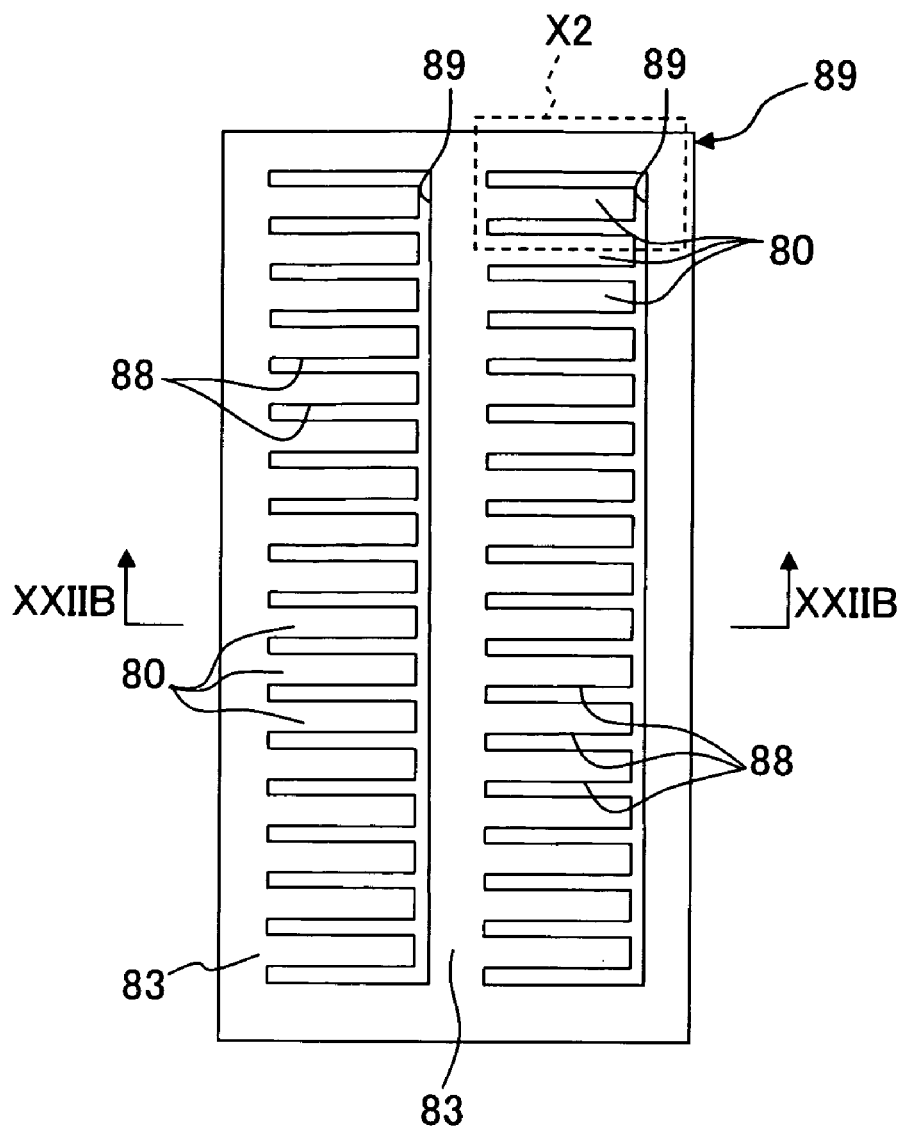
Figure 22B:
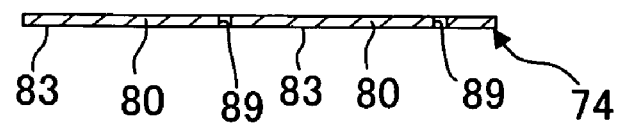

Next, a method of producing the piezoelectric actuator 65 will be explained with reference to FIGS. 22A to 26B. As shown in FIGS. 22A and 22B, a plurality of drive sections 80 aligned along the scanning direction (up and down direction in FIG. 22A) are defined in a metallic plate-shaped member 74, by forming, with a method such as etching processing, a plurality of slits 88 extending in the transporting direction (left and right direction in FIG. 22A) in the metallic plate-shaped member 74 (drive section forming step). At this time, by also forming slits 89 each of which extends in the up and down direction in FIG. 22A and connects the slits 88 with each other, the drive sections 80 are defined such that each of the drive sections 80 is connected to another drive section 80 adjacent thereto only at its left end in FIG. 22A, and is divided from other drive section 80 at its right end in FIG. 22A.

Figure 23A:
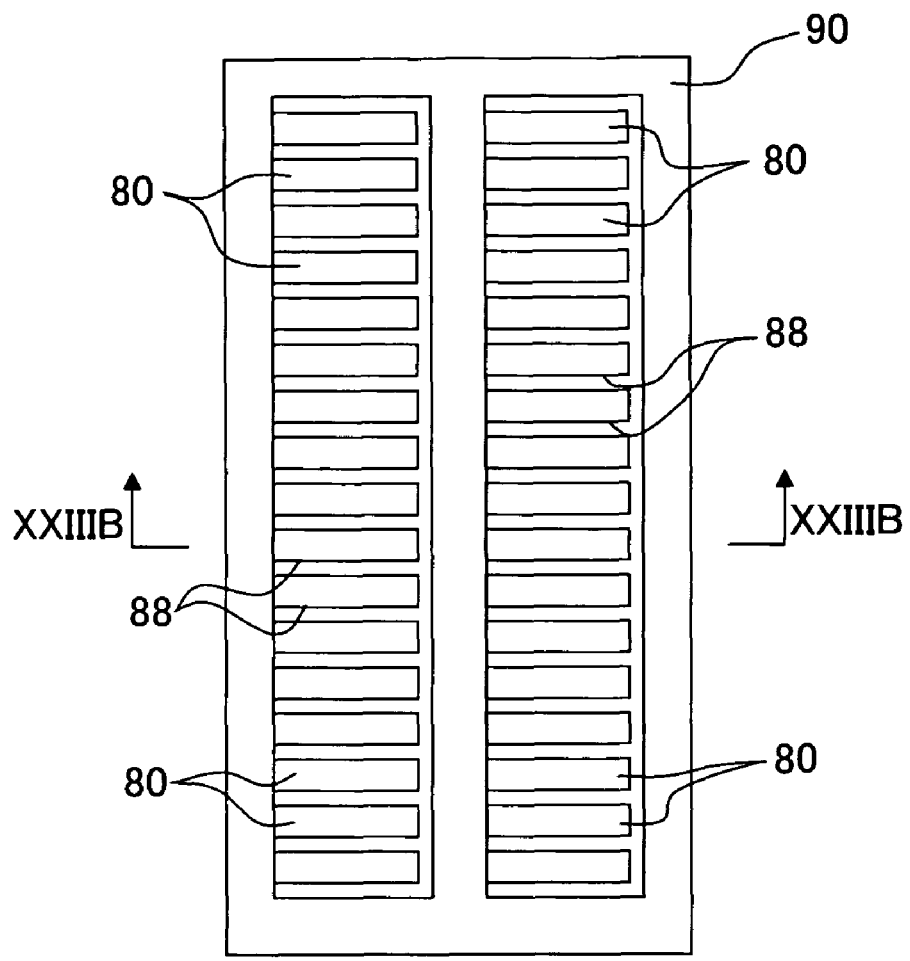
Figure 23B:
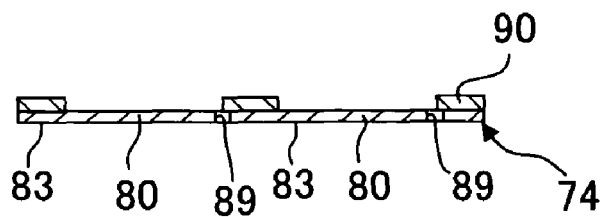
Figure 24A:
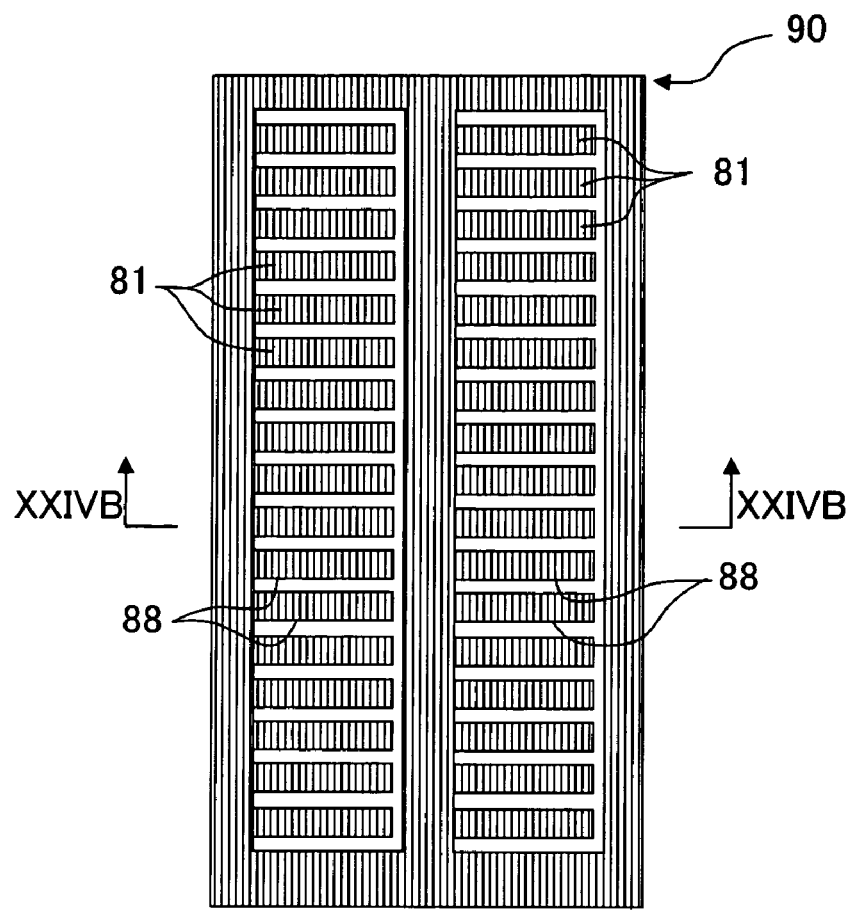
Figure 24B:
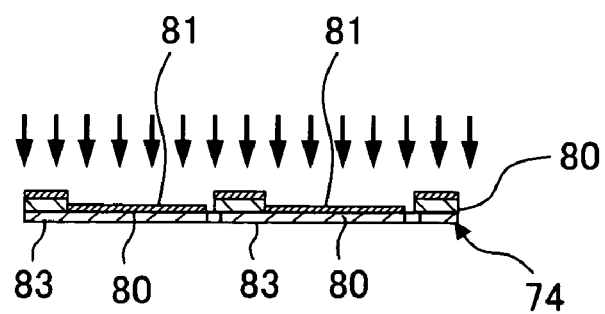

Next, as shown in FIGS. 23A and 23B, a mask 90 is placed on the upper surface of the plate-shaped member 74. The mask 90 covers an area which is outside of the area formed with the drive sections 80 and slits 88 and which includes the base sections 83. Next, as shown in FIGS. 24A and 24B, piezoelectric layers 81 are formed in the drive sections 80 respectively, by depositing particles of a piezoelectric material such as PZT onto the upper surface of the plate-shaped member 74 (piezoelectric layer forming step).

Figure 25A:
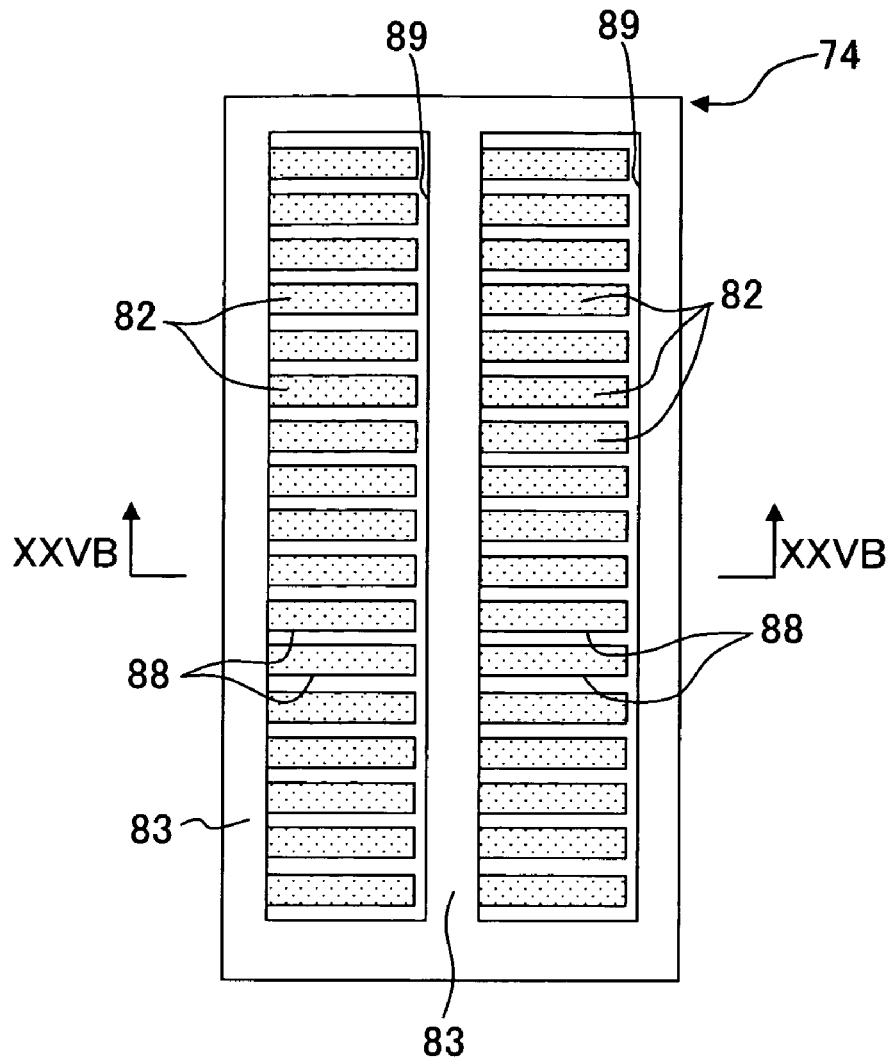
Figure 25B:
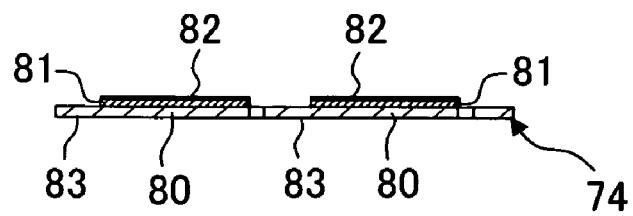
Figure 26A:
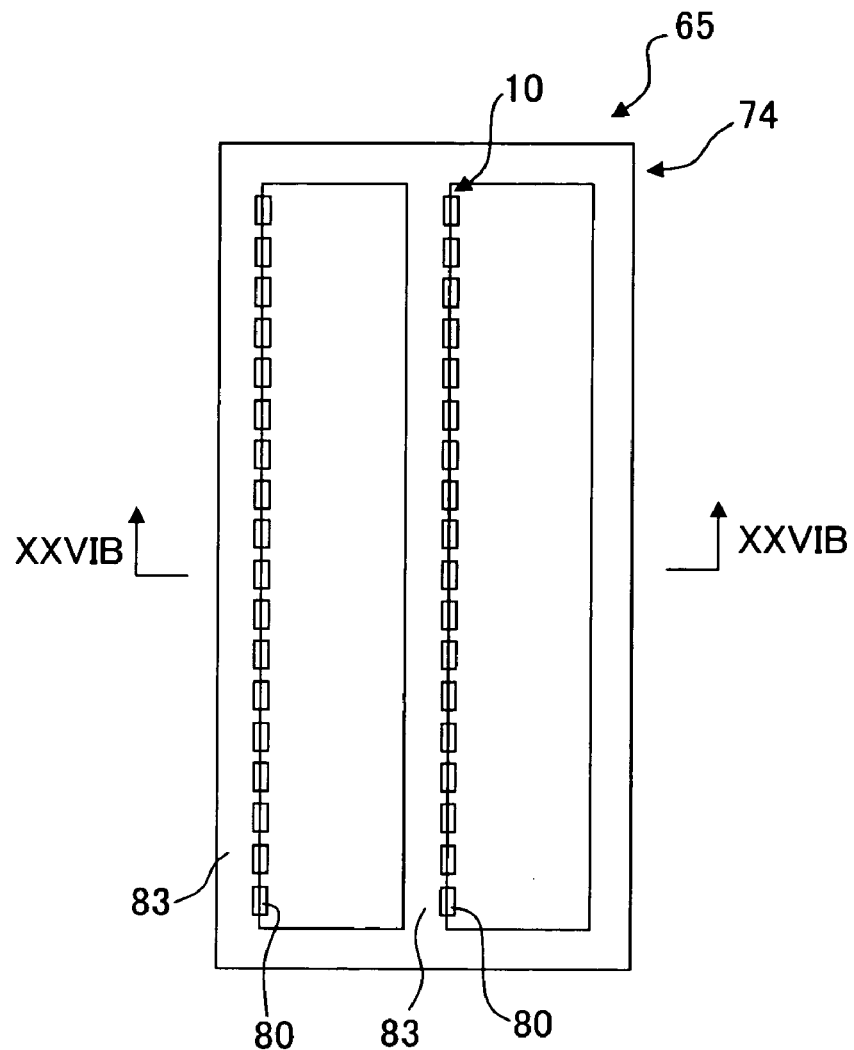
Figure 26B:
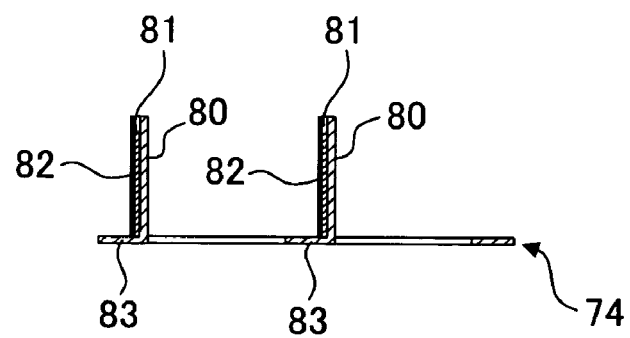

Further, as shown in FIGS. 25A and 25B, after removing the mask 90, then individual electrodes 82 are formed on the upper surfaces of the piezoelectric layers 81 respectively, with a method such as screen printing method (individual electrode forming step). Alternatively, the individual electrodes 82 may be formed by a method such as the sputtering method before removing the mask 90, and the mask 90 may be removed after forming the individual electrodes 82. Then, as shown in FIGS. 26A and 26B, the left end portions of the drive sections 82, connected to the base sections 83, are bent upwardly in an upright manner by a press processing or the like (bending step). Thus, the production of the piezoelectric actuator 65 is completed.

In this second embodiment, similarly in the first embodiment, the driving section 80 are firstly defined by forming the slits 88 in the plate-shaped member 74; then the piezoelectric layers 81 are formed in the driving sections 80 respectively, by depositing the particles of piezoelectric material onto the upper surface of the plate-shaped member 74; and then the drive sections 80 are bent. Here, when the particles of piezoelectric material are deposited onto the upper surface of the plate-shaped member 74, the particles of piezoelectric material are not deposited onto portions of the plate-shaped plate 74 at which the slits 88 are formed respectively. Accordingly, the piezoelectric layers 81 can be easily formed in the plate-shaped member only on the upper surfaces of the drive sections 80, respectively. In addition, according to this producing method, the piezoelectric actuator 65 which has the bent-shaped drive sections 80 and the piezoelectric layers 81 arranged the drive sections 80 respectively, and which is capable of realizing transport by a minute amount utilizing the bending of the drive sections 80, can be produced easily, thereby lowering the production cost.

Also in the second embodiment, changes similar to those added to the first embodiment can be added to the second embodiment. Namely, the piezoelectric layers 81 may be formed in the drive sections 80 after bending the drive sections 80 in advance. Alternatively, common electrodes may be formed separately from the drive sections 80. Still alternatively, the individual electrodes 82 may be arranged on surfaces (right side surfaces in FIG. 21B) of the piezoelectric layers 81 respectively, the surface being on the side of the drive sections 80; and the common electrodes may be arranged on the other surfaces (left side surfaces in FIG. 21B) of the piezoelectric layers 81 respectively, the other surfaces being on the side opposite to the drive sections 80. Further, it is not necessarily indispensable that the direction in which the drive sections 80 are aligned is orthogonal to the direction in which the drive sections 80 extend, and it is enough that the alignment direction is different from the extend direction.

In this second embodiment, as explained above, the particles of the piezoelectric material such as PZT are deposited onto the upper surface of the plate-shaped member 74 to form the piezoelectric layer 81 in each of the drive sections 80 (in this case, the upper surface of each of the drive sections 80 in FIGS. 24A, 24B), and further the individual electrodes 82 are formed in the piezoelectric layers 81 respectively (in this case, the upper surfaces the piezoelectric layers 81 in FIGS. 25A, 25B). However, in the piezoelectric layer forming step, the particles of the piezoelectric material may be deposited onto both surfaces of the plate-shaped member 74 so as to form the piezoelectric layers 81 on the both surfaces, respectively, of each of the drive sections 80; then in the individual electrode forming step, the individual electrodes 82 may be formed in the piezoelectric layers 81 formed in the both surfaces, respectively, of each of the drive sections 80; and in the bending step as explained above, the left end portions of the drive sections 80 may be bent upwardly in an upright manner by a press processing or the like.

In this case, when drive voltage is alternately applied to the individual electrodes 82 formed on the both surfaces, respectively, of each of the drive sections 80, the piezoelectric layers 81, each formed in the left side surface or the right side surface of each of the drive sections 80, contract alternately in the plane direction which is orthogonal to the thickness direction of the piezoelectric layer. Accordingly, with this alternate contraction of the piezoelectric layers 81, the drive section 80 is deformed so as to bend or bow alternately leftward or rightward, thereby displacing a tip portion, as a free end of the drive section, in both of leftward and rightward direction by a greater amount.

A method of producing a piezoelectric actuator having such drive sections 80 will be explained. Firstly, as explained with reference to FIGS. 22A, 22B, a plurality of drive sections 80 aligned along the scanning direction are defined in a metallic plate-shaped member 74, by forming, with a method such as etching processing, a plurality of slits 88 extending in the transporting direction in the metallic plate-shaped member 74 (drive section forming step).

Next, as explained with reference to FIGS. 23A, 23B, a mask 90 is placed on the upper surface of the plate-shaped member 74. The mask 90 covers an area which is outside of the area formed with the drive sections 80 and slits 88 and which includes the base sections 83. Next, as shown in FIGS. 24A and 24B, piezoelectric layers 81 are formed on the upper surfaces, respectively, of each of the drive sections 80, by depositing particles of a piezoelectric material such as PZT onto the upper surface of the plate-shaped member 74. Afterward, a mask 90 is placed on the lower surface of the plate-shaped member 74. The mask 90 covers an area which is outside of the area formed with the drive sections 80 and slits 88 and which includes the base sections 83. Next, as shown in FIGS. 24A and 24B, piezoelectric layers 81 are formed on the lower surfaces, respectively, of each of the drive sections 80, by depositing particles of a piezoelectric material such as PZT onto the lower surface of the plate-shaped member 74. Accordingly, the piezoelectric layers 81 are formed on both surfaces of each of the drive sections 80 (piezoelectric layer forming step).

Subsequently, as explained with reference to FIGS. 25A, 25B, after removing the mask 90 from the upper surface of the plate-shaped body 74, then individual electrodes 82 are formed on the upper surfaces of the piezoelectric layers 81 respectively, with a method such as screen printing method. Then, after removing the mask 90 from the lower surface of the plate-shaped body 74, then individual electrodes 82 are formed on the lower surfaces of the piezoelectric layers 81 respectively, with a method such as screen printing method. Accordingly, the individual electrodes 82 are formed on both surfaces of the piezoelectric layers 81 which are formed on both surfaces, respectively, of each of the drive sections 80 (individual electrode forming step).

Then, as explained with reference to FIGS. 26A, 26B, the left end portions of the drive sections 82, connected to the base sections 83, are bent upwardly in an upright manner by a press processing or the like (bending step). Thus, the production of the piezoelectric actuator 65, in which the piezoelectric layers and the individual electrodes are formed on both surfaces, respectively, of each of the drive sections 80, is completed.

In the second embodiment, although the drive sections 80 are bent in an upright manner such that the drive sections 80 project in a direction orthogonal to the plane direction of the plate-shaped member 74, the drive sections 80 may project in a direction which is inclined to some extent with respect to the direction orthogonal to the plate direction of the plate-shaped member 74, provided that the inclined direction is different from the plane direction.

Sixth Modified Embodiment

In each of the first and second embodiment, the method of producing a piezoelectric actuator having a plurality of piezoelectric actuator elements is explained. The present application, however, is also applicable to a piezoelectric actuator having a single piezoelectric actuator element. In this case, a plate-shaped member corresponding to an area surrounded by a dotted line X1 in FIG. 7A or to an area surrounded by a dotted line X2 in FIG. 22A is prepared, and by forming the slit, drive section, piezoelectric layer or the like in accordance with the steps as explained in the first or second embodiments, the piezoelectric actuator having a single actuator element can be produced.

Although the first and second embodiment as explained above are examples in which the present invention is applied to a paper transporting apparatus for a printer, the present invention is also applicable to a paper transporting apparatus usable in an apparatus or device other than printer such as a facsimile machine, a photocopy machine, a scanner or the like. In addition, the aspect to which the present invention is applicable is not limited to a transporting apparatus which transports a transporting object having a sheet-like shape such as paper, and the present application is also applicable to a transporting apparatus which transports transporting objects having various shapes such as cylinder-shaped, plate-shaped, box-shaped or tube-shaped.

Further, the present invention is applicable also to a usage other than for the transporting apparatus. For example, the present invention is applicable to a video projector including a plurality of actuators of which number corresponds to pixels, and a plurality of mirrors arranged in the actuators respectively, wherein each of the actuators configures its mirror to be displaceable between a projection-possible position and a non-projection position, and a mirror which is arranged in an actuator included in the plurality of actuators and is positioned at the projection-possible position reflects a light to project the light onto a screen, thereby forming an image. In addition, the present invention is applicable also to an optical switch which includes a plurality of actuators, and a plurality of mirrors arranged corresponding to the actuators respectively; and in which the actuators displaces the mirrors so as to selectively reflect light beams, irradiated from terminals of a plurality of optical fibers respectively, thereby guiding the light beams to terminals of a plurality of optical terminals different from the plurality of optical terminals.

Figure 27A:
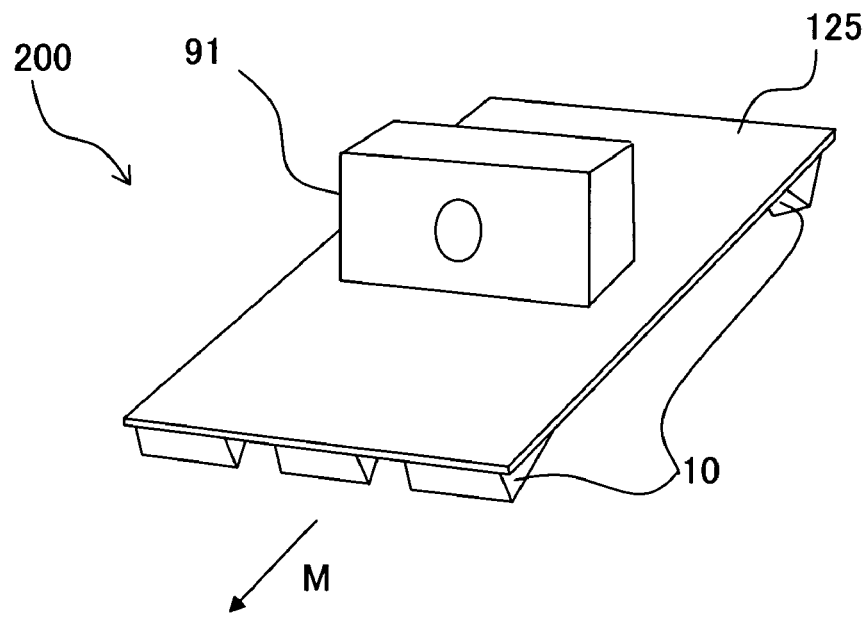
FIG. 27A is a perspective view of a movable apparatus provided with the piezoelectric actuator.
Figure 27B:
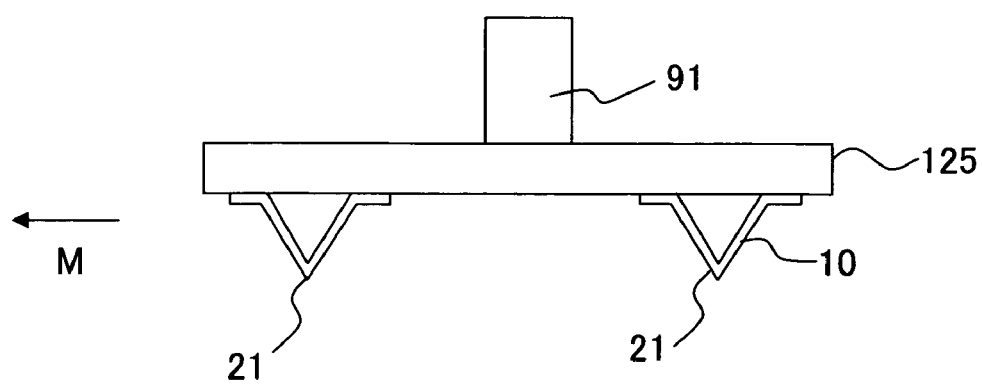
FIG. 27B is a side view of the movable apparatus provided with the piezoelectric actuator.

Further, the piezoelectric actuator produced with the production method of the present invention can be applied also to a movable apparatus which moves with respect to an object. A movable apparatus 200 as shown in FIGS. 27A and 27B has a plurality of actuator elements 10 provided to a rear surface of a substrate 125. The actuator elements 10 are arranged in the rear surface of the substrate 125 such that three of the actuator elements 10 are provided for each of rows in a front side and a rear side, in a direction of advancement M of the movable apparatus. The contact section (apex section) 21 of the actuator element 10 is arranged in downward direction and makes a contact with a floor surface. In other words, while the actuator element 10 of the first embodiment interacts with the paper P and transports the paper P, the actuator element 10 of the movable apparatus 200 interacts with an installation surface (floor surface) or an object surface, and the actuator element 10 (and the substrate 25 on which the actuator element 10 is mounted) itself moves on the installation surface or the object surface. An element 91 which has a built-in charge coupled device (CCD) is mounted on the substrate 125.

This movable apparatus 200 is suitable for an application of taking images in extremely narrow gaps, holes, in a tough environment of low temperature or high temperature, and in the space. In this example, the element 91 with the built-in charge coupled device (CCD) is mounted on the substrate 125. However, any object according to the application, such as a mirror, a temperature sensor, a micro tool, a micro robot arm can be mounted on the substrate 125. Particularly, in the producing method of the present invention, the piezoelectric actuator element 10, in which the apex section (contact section) is supported by two inclined surfaces, can be formed easily. Accordingly, the piezoelectric actuator element produced with the producing method of the present invention can be applied to a movable apparatus which is capable of mounting a comparatively heavy object on the substrate 125, and of transporting the object.

What is claimed is:

1. A method of producing a piezoelectric actuator having an actuator element, the method comprising:
    a step for providing a plate-shaped member having two surfaces;
    a drive section forming step of forming at least one slit in the plate-shaped member using an etching process, wherein at least a portion of a perimeter of the at least one slit defines at least a portion of at least one drive section;
    a piezoelectric layer forming step of forming a piezoelectric layer on the at least one drive section by depositing particles of a piezoelectric material on a first surface of the two surfaces of the plate-shaped member;
    an electrode forming step of forming an electrode for applying an electric field in a thickness direction of the piezoelectric layer, which is perpendicular to the first surface of the plate-shaped member, the piezoelectric layer being formed on the electrode;
    an insulating layer forming step of forming an insulating layer on the first surface of the plate-shaped member, wherein the insulating layer forming step is performed before the piezoelectric layer forming step; and
    a bending step of bending the at least one drive section,
    wherein before the piezoelectric layer forming step, in the electrode forming step, the electrode and a wiring, which is to be connected to the electrode, are formed on a surface of the insulating layer,
    wherein the electrode is arranged on the first surface of the plate-shaped member via the insulating layer, such that the wiring to be connected to the electrode is freely wired on the surface of the insulating layer, and
    wherein the plate-shaped member is made of a metallic material.

2. The method of producing the piezoelectric actuator according to claim 1, wherein the bending step is performed after the piezoelectric layer forming step.

3. The method of producing the piezoelectric actuator according to claim 1, wherein in the piezoelectric layer forming step, the piezoelectric layer is formed by one of an aerosol deposition method, a chemical vapor deposition method and a sputtering method.

4. The method of producing the piezoelectric actuator according to claim 1, further comprising, before the bending step, a recess forming step of forming a recess in the plate-shaped member at a portion which is to be bent in the bending step.

5. The method of producing the piezoelectric actuator according to claim 1, wherein in the drive section forming step, the at least one slit is formed as a plurality of individual slits which extend in a first direction, and aligned in a second direction different from the first direction; and the at least one drive section is defined, by the plurality of individual slits, as a plurality of individual drive sections which are aligned along the second direction.

6. The method of producing the piezoelectric actuator according to claim 5, wherein in the drive section forming step, the plurality of individual slits are formed such that each of the plurality of individual drive sections is connected, at both ends thereof in the first direction, to the plate-shaped member; and in the bending step, each of the plurality of individual drive sections is bent at the both ends thereof in the first direction and at a middle portion thereof located between the both ends.

7. The method of producing the piezoelectric actuator according to claim 5, wherein in the drive section forming step, the plurality of individual slits are formed such that each of the plurality of individual drive sections is connected, only at one end thereof in the first direction, to the plate-shaped member; and in the bending step, each of the plurality of individual drive sections is bent at the one end thereof in the first direction such that each of the plurality of individual drive sections is parallel to a direction different from a direction of a plane of the plate-shaped member.

8. The method of producing the piezoelectric actuator according to claim 5, wherein the first direction is orthogonal to the second direction.

9. The method of producing the piezoelectric actuator according to claim 1, wherein the plate-shaped member serves as a common electrode.

10. The method of producing the piezoelectric actuator according to claim 1, wherein the piezoelectric actuator is to be provided in a transporting apparatus which transport an object in a predetermined transporting direction.

11. A method of producing a movable apparatus which moves with respect to an object, the method comprising the steps of:
    providing a plate-shaped substrate;
    producing a piezoelectric actuator with the method as defined in claim 1; and
    joining the substrate and the piezoelectric actuator at a second surface of the two surfaces of the plate-shaped member of the piezoelectric actuator.

12. The method of producing the piezoelectric actuator according to claim 1, further comprising:
    depositing, in the piezoelectric layer forming step, the particles of the piezoelectric material onto the second surface of the plate-shaped member to form a piezoelectric layer on the second surface; and
    forming, in the electrode forming step, an electrode for applying electric field in the thickness direction of the piezoelectric layer, in the piezoelectric layer formed on the second surface of the plate-shaped member.

13. The method of producing the piezoelectric actuator according to claim 1, wherein the drive section forming step further comprises forming a first slit and a second slit, wherein at least a portion of the perimeter of the first slit and at least a portion of the perimeter of the second slit define at least a portion of the at least one drive section therebetween.

* * * * *